(12) United States Patent
Butterbaugh et al.

(10) Patent No.: US 10,020,217 B2
(45) Date of Patent: Jul. 10, 2018

(54) SYSTEMS AND METHODS FOR TREATING SUBSTRATES WITH CRYOGENIC FLUID MIXTURES

(71) Applicant: TEL FSI, Inc., Chaska, MN (US)

(72) Inventors: Jeffery W. Butterbaugh, Eden Prairie, MN (US); Chimaobi W. Mbanaso, Chaska, MN (US); David Scott Becker, Excelsior, MN (US)

(73) Assignee: TEL FSI, INC., Chaska, MN (US)

( * ) Notice: Subject to any disclaimer, the term of this patent is extended or adjusted under 35 U.S.C. 154(b) by 0 days.

(21) Appl. No.: 14/876,242

(22) Filed: Oct. 6, 2015

(65) Prior Publication Data

US 2016/0096210 A1    Apr. 7, 2016

Related U.S. Application Data

(60) Provisional application No. 62/060,130, filed on Oct. 6, 2014, provisional application No. 62/141,026, filed on Mar. 31, 2015.

(51) Int. Cl.
*B08B 5/04* (2006.01)
*H01L 21/683* (2006.01)
(Continued)

(52) U.S. Cl.
CPC .............. *H01L 21/683* (2013.01); *B08B 5/04* (2013.01); *H01L 21/02041* (2013.01); *H01L 21/02043* (2013.01); *H01L 21/67051* (2013.01)

(58) Field of Classification Search
None
See application file for complete search history.

(56) References Cited

U.S. PATENT DOCUMENTS

| | | |
|---|---|---|
| 4,806,171 A | 2/1989 | Whitlock et al. |
| 5,062,898 A | 11/1991 | McDermott et al. |

(Continued)

FOREIGN PATENT DOCUMENTS

JP    2000-262997    9/2000

OTHER PUBLICATIONS

Martinez, Mixtures, 2016, martinez, 5 excerpts pertaining to mixtures.*
Thuneberg, Research on helium in LTL, Aug. 19, 2003, Helsinki University of Technology, 4He phase diagram, 3He phase diagram.*
Leach, Chemical Systems Prone to Complexity, 2016, Leach, Tittle, excerpts pertaining to gas, liquid and solid phases.*

(Continued)

*Primary Examiner* — Binh X Tran
*Assistant Examiner* — David Cathey, Jr.
(74) *Attorney, Agent, or Firm* — Kagan Binder, PLLC

(57) ABSTRACT

Disclosed herein are systems and methods for treating the surface of a microelectronic substrate, using a cryogenic fluid mixture used to treat an exposed surface of the microelectronic substrate. The fluid mixture may be expanded through a nozzle to form an aerosol spray or gas cluster jet (GCJ) spray may impinge the microelectronic substrate and remove particles from the microelectronic substrate's surface. The fluid mixture may include nitrogen, argon, helium, neon, xenon, krypton, carbon dioxide, or any combination thereof. The incoming fluid mixture may be maintained pressure greater than atmospheric pressure and at a temperature greater than the condensation temperature of the fluid mixture. The fluid mixture may be expanded into the treatment chamber to form an aerosol or gas cluster spray. In this embodiment, the nozzle may be positioned within 50 mm of the microelectronic substrate during the treatment, more preferably within 10 mm of the microelectronic substrate.

20 Claims, 17 Drawing Sheets

(51) Int. Cl.
*H01L 21/67* (2006.01)
*H01L 21/02* (2006.01)

(56) References Cited

U.S. PATENT DOCUMENTS

| | | | |
|---|---|---|---|
| 5,209,028 | A | 5/1993 | McDermott et al. |
| 5,294,261 | A | 3/1994 | McDermott et al. |
| 5,512,106 | A | 4/1996 | Tamai et al. |
| 5,810,942 | A | 9/1998 | Narayanswami et al. |
| 5,942,037 | A | 8/1999 | Wagener et al. |
| 5,961,732 | A | 10/1999 | Patrin et al. |
| 6,449,873 | B1 | 9/2002 | Yoon et al. |
| 6,578,369 | B2 | 6/2003 | Kunkel et al. |
| 8,454,409 | B2 | 6/2013 | Bowers et al. |
| 2003/0188763 | A1 | 10/2003 | Banerjee et al. |
| 2005/0263170 | A1 | 12/2005 | Tannous et al. |
| 2006/0099832 | A1 | 5/2006 | Lucarini et al. |
| 2008/0213978 | A1 | 9/2008 | Henry et al. |
| 2009/0126760 | A1* | 5/2009 | Banerjee ............ B08B 3/02 134/1 |
| 2010/0167552 | A1 | 7/2010 | Bashyam et al. |
| 2012/0256276 | A1* | 10/2012 | Hwang .......... H01L 21/823842 257/410 |
| 2013/0160794 | A1 | 6/2013 | Griffith Cruz et al. |
| 2013/0164930 | A1* | 6/2013 | Tu .................. H01L 21/31053 438/595 |
| 2014/0230860 | A1 | 8/2014 | Chua et al. |
| 2016/0096206 | A1 | 4/2016 | Butterbaugh et al. |
| 2016/0096207 | A1 | 4/2016 | Butterbaugh et al. |
| 2016/0096209 | A1 | 4/2016 | Butterbaugh et al. |
| 2016/0303617 | A1 | 10/2016 | Mbanaso et al. |

OTHER PUBLICATIONS

Chen et al., "Pressure dependence of argon cluster size for different nozzle geometries", Journal of Applied Physics, Sep. 2, 2009, pp. 1-6, vol. 106, No. 053507, American Institute of Physics.

Ditmire et al., "Characterization of a cryogenically cooled high-pressure gas jet for laser/cluster interaction experiments", Review of Scientific Instruments, Nov. 1998, pp. 1-7, vol. 69, No. 11, The Blackett Laboratory, Imperial College of Science, Technology, and Medicine, London SW7 2BZ, United Kingdom.

Goldby, Ian Michael, "Dynamics of Molecules and Clusters at Surfaces", A dissertation submitted for the degree of Doctor of Philosophy at the University of Cambridge, Apr. 1996, pp. 1-10, Clare College, Cambridge.

Hagena et al., "Cluster Formation in Expanding Supersonic Jets: Effect of Pressure, Temperature, Nozzle Size, and Test Gas", The Journal of Chemical Physics, Mar. 1, 1972, pp. 1793-1802, vol. 56, No. 5, Institut für Kernverfahrenstechnik der Universität and des Kernforschungszentrums, 75 Karlsruhe, Germany.

Tisch et al., "Interaction of intense laser pulses with atomic clusters: Measurements of ion emission, simulations and applications", Nuclear Instruments and Methods in Physics Research, 2003, pp. 310-323, vol. 205.

PCT International Search Report, International Application No. PCT/US2015/054257, dated Jan. 22, 2016, 25 pages.

PCT International Search Report, International Application No. PCT/US2016/040801, dated Mar. 20, 2017, 14 pages.

ChemicaLogic Corporation, Carbon Dioxide: Temperature—pressure Diagram, 1 p. (US Publication No. 2016/0096209, Dec. 1, 2016).

"Vacuum" from Wikipedia, the free encyclopedia, pp. 11-14, Aug. 31, 2017.

* cited by examiner

SYSTEMS AND METHODS FOR TREATING SUBSTRATES WITH CRYOGENIC FLUID MIXTURES

RELATED APPLICATIONS

This application claims priority to U.S. Provisional Patent Application No. 62/060,130 filed Oct. 6, 2014 and U.S. Provisional Patent Application No. 62/141,026 filed Mar. 31, 2015, the contents of which are incorporated herein by reference in their entirety.

FIELD OF USE

This disclosure relates to an apparatus and method for treating the surface of a microelectronic substrate, and in particular for removing objects from the microelectronic substrate using cryogenic fluids.

BACKGROUND

Advances in microelectronic technology have cause integrated circuits (ICs) to be formed on microelectronic substrates (e.g., semiconductor substrates) with ever increasing density of active components. IC manufacturing may be carried out by the application and selective removal of various materials on the microelectronic substrate. One aspect of the manufacturing process may include exposing the surface of the microelectronic substrate cleaning treatments to remove process residue and/or debris (e.g., particles) from the microelectronic substrate. Various dry and wet cleaning techniques have been developed to clean microelectronic substrates.

However, the advances of microelectronic IC manufacturing have led to smaller device features on the substrate. The smaller device features have made the devices more susceptible to damage from smaller particles than in the past. Hence, any techniques that enable the removal of smaller particles, and/or relatively larger particles, without damaging the substrate would be desirable.

SUMMARY

Described herein are several apparatus and methods that may use a variety of different fluids or fluid mixtures to remove objects (e.g., particles) from microelectronic substrates. In particular, the fluid or fluid mixtures may be exposed to the microelectronic substrate in a manner that may remove particles from a surface of the microelectronic substrate. The fluid mixtures may include, but are not limited to, cryogenic aerosols and/or gas cluster jet (GCJ) sprays that may be formed by the expansion of the fluid mixture from a high pressure (e.g., greater than atmospheric pressure) environment to a lower pressure environment (e.g., sub-atmospheric pressure) that may include the microelectronic substrate.

The embodiments described herein have demonstrated unexpected results by improving particle removal efficiency for sub-100 nm particles without diminution of larger (e.g., >100 nm) particle removal efficiency and/or without damaging microelectronic substrate features during particle removal. The damage reduction may have been enabled by avoiding liquification or reducing (e.g., <1% by weight) liquification of the fluid mixture prior to expansion.

Additional unexpected results included demonstrating a wider cleaning area (~100 mm) from a single nozzle. One enabling aspect of the wider cleaning area has been shown to be based, at least in part, on minimizing the gap distance between the nozzle and the microelectronic substrate. The increased cleaning area size may reduce cycle time and chemical costs. Further, one or more unique nozzles may be used to control the fluid mixture expansion that may be used to remove particles from the microelectronic substrate.

According to one embodiment, an apparatus for treating the surface of a microelectronic substrate via impingement of the surface with at least one fluid is described. The apparatus may include: a treatment chamber defining an interior space to treat a microelectronic substrate with at least one fluid within the treatment chamber; a movable chuck that supports the substrate within the treatment chamber, the substrate having an upper surface exposed in a position for treatment by the at least one fluid; a substrate translational drive system operatively coupled to the movable chuck and configured to translate the movable chuck between a substrate load position and at least one processing position at which the substrate is treated with the at least one fluid; a substrate rotational drive system operatively coupled to the treatment chamber and configured to rotate the substrate; and at least one fluid expansion component (e.g., nozzle) connected to at least one fluid supply and arranged within the treatment chamber in a manner effective to direct a fluid mixture towards the upper surface of the substrate when the movable chuck is positioned in the at least one processing position and supports the substrate.

According to one embodiment, an apparatus for treating the surface of a microelectronic substrate via impingement of the surface with at least one fluid is described. The apparatus may include: a treatment chamber defining an interior space to treat a microelectronic substrate with at least one fluid within the treatment chamber; a movable chuck that supports the substrate within the treatment chamber, the substrate having an upper surface exposed in a position for treatment by the at least one fluid; a substrate translational drive system operatively coupled to the movable chuck and configured to translate the movable chuck between a substrate load position and at least one processing position at which the substrate is treated with the at least one fluid; a substrate rotational drive system operatively coupled to the treatment chamber and configured to rotate the substrate; and at least one fluid expansion component (e.g., nozzle) connected to at least one fluid supply and arranged within the treatment chamber in a manner effective to direct a fluid mixture towards the upper surface of the substrate when the movable chuck is positioned in the at least one processing position and supports the substrate.

According to another embodiment, a method for treating the surface of a substrate via impingement of the surface with a cryogenic fluid mixture is described herein. The fluid mixture may include, but is not limited to, nitrogen, argon, xenon, helium, neon, krypton, carbon dioxide, or any combination thereof. The incoming fluid mixture may be maintained pressure greater than atmospheric pressure and at a temperature greater than the condensation temperature of the fluid mixture. The fluid mixture may be expanded into the treatment chamber to form an aerosol or gas cluster spray. The expansion may be implemented by passing the fluid mixture through a nozzle into the treatment chamber that may be maintained at 35 Torr or less. In this embodiment, the nozzle may be positioned within 50 mm of the microelectronic substrate during the treatment, more preferably within 10 mm of the microelectronic substrate.

According to another embodiment, a method for treating the surface of a substrate via impingement of the surface with an aerosol spray is described. The fluid expansion component may receive fluids at or below 273K and at a pressure greater than or equal to 50 pounds per square inch (psi). The fluid mixture may include one or more states such as gas, liquid, or a combination thereof. The fluid expansion component may expand the gas to the vacuum process chamber that may be maintained at a pressure of less than 35 Torr. The fluid mixture provided to the nozzle may be relatively inert to the substrate and may include a first portion of the fluid mixture that has a molecular weight less than 28 (e.g., He) and a second portion of the fluid mixture that may have a molecular weight of greater than 28 (e.g., Ar, $N_2$). In one embodiment, the fluid mixture may include at least 10% by weight of the first portion. In another embodiment, the fluid mixture may include at least 50% by weight of the first portion.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION OF SEVERAL EMBODIMENTS

Figure 1:
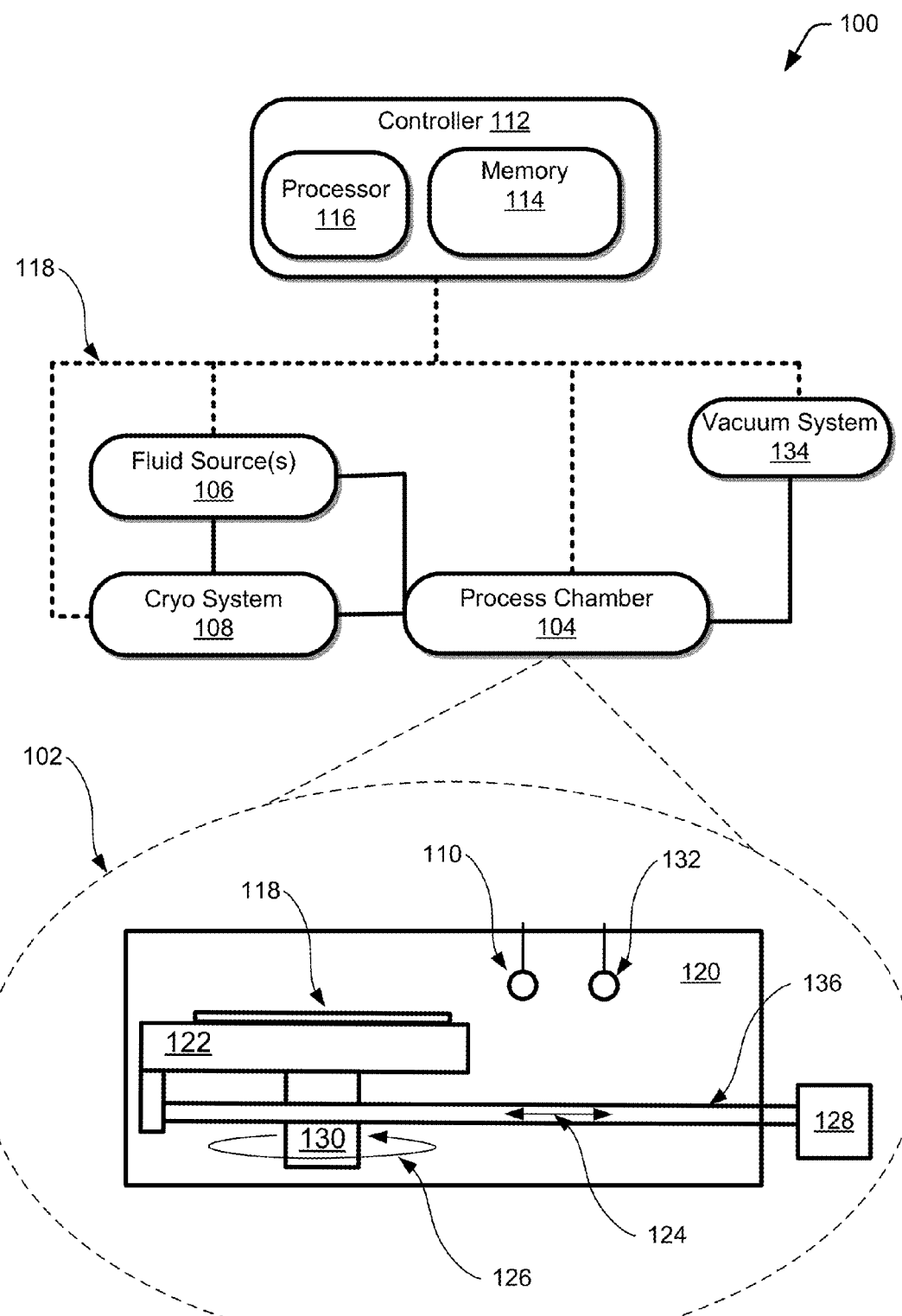
FIG. 1 includes a schematic illustration of a cleaning system and a cross-section illustration of a process chamber of the cleaning system according to at least one embodiment of the disclosure.

Methods for selectively removing objects from a microelectronic substrate are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the disclosure. Similarly, for purposes of explanation, specific numbers, materials, and configurations are set forth to provide a thorough understanding of the systems and method. Nevertheless, the systems and methods may be practiced without specific details. Furthermore, it is understood that the various embodiments shown in the figures are illustrative representations and are not necessarily drawn to scale, except for FIGS. 6A & 6B.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic substrate" as used herein generically refers to the object being processed in accordance with the invention. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. In addition to microelectronic substrates, the techniques described herein may also be used to clean reticle substrates that may be used to patterning of microelectronic substrates using photolithography techniques.

Cryogenic fluid cleaning is a technique used to dislodge contaminants by imparting sufficient energy from aerosol particles or gas jet particles (e.g., gas clusters) to overcome the adhesive forces between the contaminants and the microelectronic substrate. Hence, producing or expanding cryogenic fluid mixtures (e.g., aerosols spray and/or gas cluster jet spray) of the right size and velocity may be desirable. The momentum of the aerosols or clusters is a function of mass and the velocity. The momentum may be increased by increasing velocity or mass, which may be important to overcome the strong adhesive forces between the particle and the surface of the substrate especially when the particle may be very small (<100 nm).

In order to influence the velocity of a cryogenic fluid, a carrier gas, comprised of atoms/molecules of relatively smaller or larger atomic weight, can be incorporated into the fluid mixture and enhance the cleaning of the contaminants on the substrate. The carrier gas may or may not be cryogenically cooled with the remainder of fluid mixture. The carrier gas will supply a partial pressure in addition to the partial pressure of the primary cryogen mixture. The partial pressure and gas temperature may be adjusted to place the fluid mixture in liquid/gas state or gas state to enhance the cleaning ability of the system. This technique satisfies a growing need in the semiconductor industry to enhance cleaning of substrates with small contaminates that traditional aerosol techniques are limited due to insufficient kinetic energy.

FIG. 1 includes a schematic illustration of a cleaning system 100 that may be used to clean microelectronic substrates using aerosol sprays or gas cluster jet (GCJ) sprays and a cross section illustration 102 of the process chamber 104 where the cleaning takes place. The aerosol spray or GCJ spray may be formed by expanding cryogenically cooled fluid mixtures into a sub-atmospheric environment in the process chamber 104. As shown in FIG. 1, one or more fluid sources 106 may provide pressurized fluid(s) to a cryogenic cooling system 108 prior to being expanded through a nozzle 110 in the process chamber 102. The vacuum system 112 may be used to maintain the sub atmospheric environment in the process chamber 104 and to remove the fluid mixture as needed.

In this application, one or more of the following variables may be important to removing objects from the microelectronic substrate: pressures and temperatures of the incoming fluid mixture in the nozzle 110 prior to expansion, the flow rate of the fluid mixture, the composition and ratio of the fluid mixture and the pressure in the process chamber 104. Accordingly, a controller 112 may be used to store the process recipes in memory 114 and may use a computer processor 116 to issue instructions over a network 118 that controls various components of the cleaning system 100 to implement the cleaning techniques disclosed herein.

A person of ordinary skill in the art semiconductor processing may be able to configure the fluid source(s) 106, cryogenic cooling system, the vacuum system 134 and their respective sub-components (not shown, e.g., sensors, controls, etc.) to implement the embodiments described herein. For example, in one embodiment, the cleaning system 100 components may be configured to provide pressurized fluid mixtures between 50 psig and 800 psig. The temperature of the fluid mixture may be maintained in the range of 70 K and 270 K, but preferably between 70 K and 150 K, by passing the fluid mixture through a liquid nitrogen dewar of the cryogenic cooling system 108. The vacuum system 134 may be configure to maintain the process chamber 104 at a pressure that may be less than 35 Torr to enhance the formation of aerosols and/or gas clusters, or more preferably less than 10 Torr.

The pressurized and cooled fluid mixture may be expanded into the process chamber 104 through the nozzle 110 that may direct the aerosol spray or GCJ spray towards the microelectronic substrate 118. At least one nozzle 110 may be supported within the process chamber 104, with the nozzle 110 having at least one nozzle orifice that directs the fluid mixture towards the microelectronic substrate 118. For example, in one embodiment, the nozzle 110 may be a nozzle spray bar that has a plurality of openings along the length of the nozzle spray. The nozzle 110 may be adjustable so that the angle of the fluid spray impinging on the microelectronic substrate 118 can be optimized for a particular treatment. The microelectronic substrate 118 may secured to a movable chuck 122 that provides at least one translational degree of freedom 124, preferably along the longitudinal axis of the vacuum chamber 120, to facilitate linear scanning at least a portion of microelectronic substrate 128 through the fluid spray emanating from the nozzle 110. The movable chuck may be coupled to the substrate translational drive system 128 that may include one or more slides and guiding mechanisms to define the path of movement of the movable chuck 122, and an actuating mechanism may be utilized to impart the movement to the movable chuck 122 along its guide path. The actuating mechanism may comprise any electrical, mechanical, electromechanical, hydraulic, or pneumatic device. The actuating mechanism may be designed to provide a range of motion sufficient in length to permit movement of the exposed surface of the microelectronic substrate 118 at least partly through the area of fluid spray emanating from the at least one nozzle 110. The substrate translational drive system 128 may include a support arm (not shown) arranged to extend through a sliding vacuum seal (not shown) in a wall of vacuum chamber 120, wherein a first distal end is mounted to the movable chuck 122 and a second distal end is engaged with an actuator mechanism located outside the vacuum chamber 120.

Furthermore, the movable chuck 122 may also include a substrate rotational drive system 130 that may provide at least one rotational degree of freedom 126, preferably about an axis normal to the exposed surface of the microelectronic substrate 118, to facilitate rotational indexing of the microelectronic substrate 118 from a first pre-determined indexed position to a second pre-determined indexed position that exposes another portion of the microelectronic substrate 118 to the fluid spray. In other embodiments, the moveable chuck 122 may rotate at a continuous speed without stopping at any indexed position. Additionally, the movable chuck 122 may vary the angle of incidence with the fluid spray by changing the position of the microelectronic substrate 118, in conjunction with varying the angle of the nozzle 110, or just by itself.

In another embodiment, the movable chuck 122 may include a mechanism for securing the microelectronic substrate 118 to an upper surface of the movable chuck 122 during impingement of the at least one fluid spray on the exposed surface of the microelectronic substrate 118. The microelectronic substrate 118 may be affixed to the movable chuck 122 using mechanical fasteners or clamps, vacuum clamping, or electrostatic clamping, for example as might be practiced by a person of ordinary skill in the art of semiconductor processing.

Furthermore, the movable chuck 122 may include a temperature control mechanism to control a temperature of the microelectronic substrate 118 at a temperature elevated above or depressed below ambient temperature. The temperature control mechanism can include a heating system (not shown) or a cooling system (not shown) that is configured to adjust and/or control the temperature of movable chuck 122 and microelectronic substrate 118. The heating system or cooling system may comprise a re-circulating flow of heat transfer fluid that receives heat from movable chuck 122 and transfers heat to a heat exchanger system (not shown) when cooling, or transfers heat from the heat exchanger system to movable chuck 122 when heating. In other embodiments, heating/cooling elements, such as resistive heating elements, or thermo-electric heaters/coolers can be included in the movable chuck 122.

As shown in FIG. 1, the process chamber 102 may include a dual nozzle configuration (e.g., second nozzle 132) that may enable the processing of the substrate 118 using a cryogenic aerosol and/or a GCJ spray or a combination thereof within the same vacuum chamber 120. However, the dual nozzle configuration is not required. Some examples of nozzle 110 design will be described in the descriptions of FIGS. 2A-4. Although the nozzles 110, 132 are shown to be positioned in a parallel manner they are not required to be parallel to each other to implement the cleaning processes. In other embodiments, the nozzles 110,132 may be at opposite ends of the treatment chamber 120 and the movable chuck 122 may move the substrate 118 into a position that enables one or more of the nozzles 110,132 to spray a fluid mixture onto the microelectronic substrate 118.

In another embodiments, the microelectronic substrate 118 may be moved, such that the exposed surface area (e.g., area that include the electronic devices) of the microelectronic substrate 118 may be impinged by the fluid mixture (e.g., aerosol or GCJ) provided from the first nozzle 110 and/or the second nozzle 132 at the same or similar time (e.g., parallel processing) or at different times (e.g., sequential processing). For example, the cleaning process may include an aerosol cleaning process followed by a GCJ cleaning processes or vice versa. Further, the first nozzle 110 and the second nozzle 132 may be positioned so their respective fluid mixtures impinge the microelectronic substrate 118 at different locations at the same time. In one instance, the substrate 118 may be rotated to expose the entire microelectronic substrate 118 to the different fluid mixtures.

The nozzle 110 may be configured to receive low temperature (e.g., <273K) fluid mixtures with inlet pressures (e.g., 50 psig-800 psig) substantially higher than the outlet pressures (e.g., <35 Torr. The interior design of the nozzle 110 may enable the expansion of the fluid mixture to generate solid and/or liquid particles that may be directed towards the microelectronic substrate 118. The nozzle 110 dimensions may have a strong impact on the characteristics of the expanded fluid mixture and range in configuration from simple orifice(s) arranged along a spray bar, multi-expansion volume configurations, to single expansion volume configurations. FIGS. 2A-4 illustrate several nozzle 110 embodiments that may be used. However, the scope of the disclosure may not be limited to the illustrated embodiments and the methods disclosed herein may apply to any nozzle 110 design. As noted above, the nozzle 110 figures may not be drawn to scale.

Figure 2A:
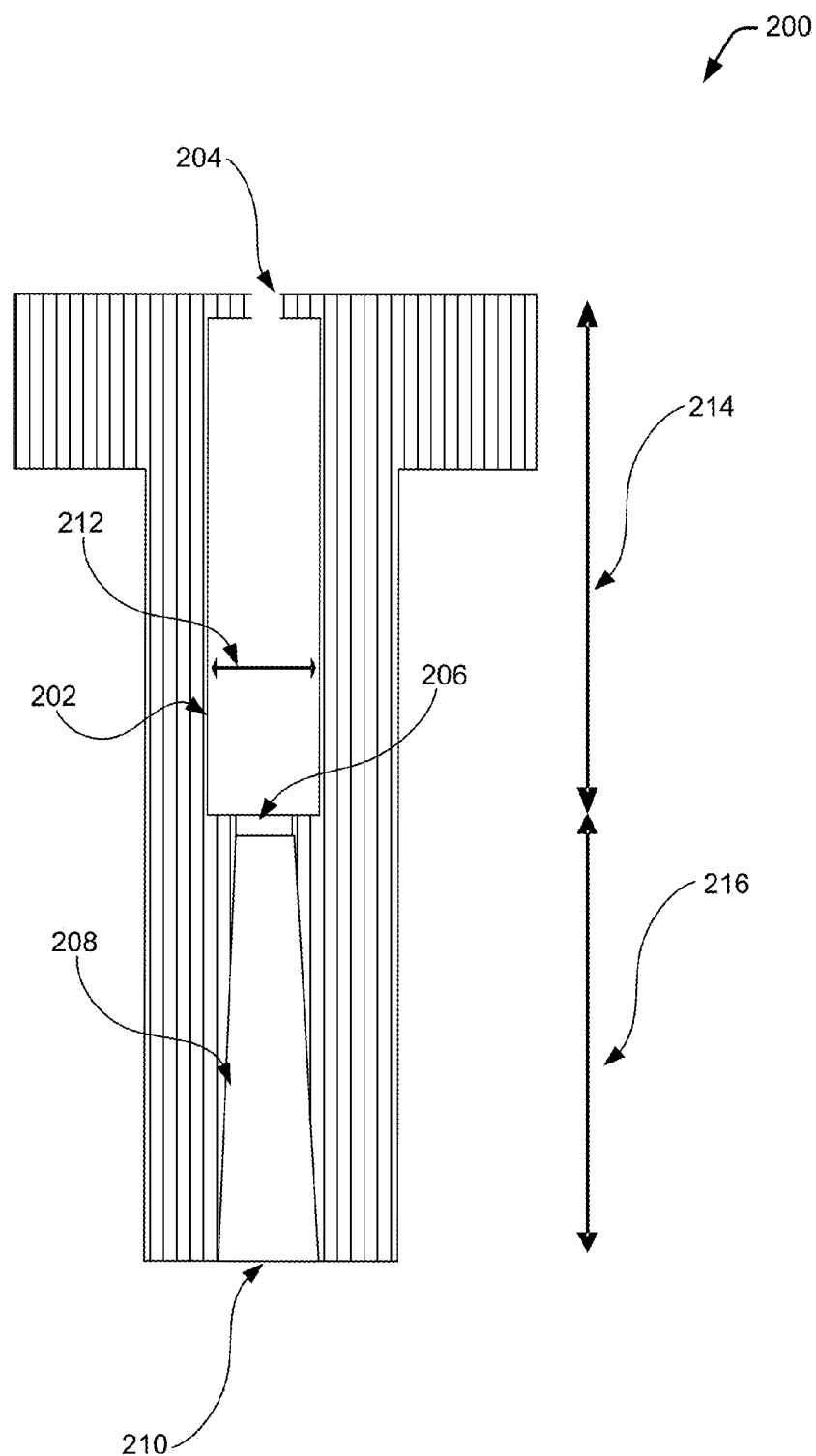
FIGS. 2A and 2B include cross-section illustrations of a two-stage gas nozzles according to at least two embodiments of the disclosure.

FIG. 2A includes a cross-section illustration of a two-stage gas nozzle 200 that may include two gas expansion regions that may be in fluid communication with each other and may subject the fluid mixture to pressure changes as the fluid mixture progresses through the two-stage gas (TSG) nozzle 200. The first stage of the TGS nozzle 200 may be a reservoir component 202 that may receive the fluid mixture through an inlet 204 that may be in fluid communication with the cryogenic cooling system 108 and the fluid sources 106. The fluid mixture may expand into the reservoir component 202 to a pressure that may be less than the inlet pressure. The fluid mixture may flow through a transition orifice 206 to the outlet component 208. In some embodiments, the fluid mixture may be compressed to a higher pressure when it flows through the transition orifice 206. The fluid mixture may expand again into the outlet component 208 and may contribute to the formation of an aerosol spray or gas cluster jet as the fluid mixture is exposed to the low pressure environment of the vacuum chamber 120 via the outlet orifice 210. Broadly, the TGS nozzle 200 may incorporate any dimension design that may enable a dual expansion of the fluid mixture between the inlet orifice 204 and the outlet orifice 210. The scope of TGS nozzle 200 may not be limited to the embodiments described herein.

In the FIG. 2A embodiment, the reservoir component 202 may include a cylindrical design that extends from the inlet orifice 204 to the transition orifice 206. The cylinder may have a diameter 212 that may vary from the size of the transition orifice 206 to more than three times the size of the transition orifice 206.

In one embodiment, the TGS nozzle 200 may have an inlet orifice 204 diameter that may range between 0.5 mm to 3 mm, but preferably between 0.5 mm and 1.5 mm. The reservoir component 208 may comprise a cylinder with a diameter 212 between 2 mm and 6 mm, but preferably between 4 mm and 6 mm. The reservoir component 208 may have a length 214 between 20 mm and 50 mm, but preferably between 20 mm and 25 mm. At the non-inlet end of the reservoir component 208 may transition to a smaller diameter that may enable the fluid mixture to be compressed through the transition orifice 206 into the outlet component 208.

The transition orifice 206 may exist in several different embodiments that may be used to condition the fluid mixture as it transitions between the reservoir component 202 and the outlet component 208. In one embodiment, the transition orifice 206 may be a simple orifice or opening at one end of the reservoir component 202. The diameter of this transition orifice 206 may range between 2 mm and 5 mm, but preferably between 2 mm and 2.5 mm. In another embodiment, as shown in FIG. 2A, the transition orifice 206 may have a more substantial volume than the simple opening in the previous embodiment. For example, the transition orifice 206 may have a cylindrical shape that may be constant along a distance that may be less than 5 mm. In this embodiment, the diameter of the transition orifice 206 may be larger than the initial diameter of the outlet component 208. In this instance, a step height may exist between the transition orifice 206 and the outlet component 208. The step height may be less than 1 mm. In one specific embodiment, the step height may be about 0.04 mm. The outlet component 208 may have a conical shape that increases in diameter between the transition orifice 206 and the outlet orifice 208. The conical portion of the outlet component 208 may have a half angle between 3° and 10°, but preferably between 3° and 6°.

Figure 2B:
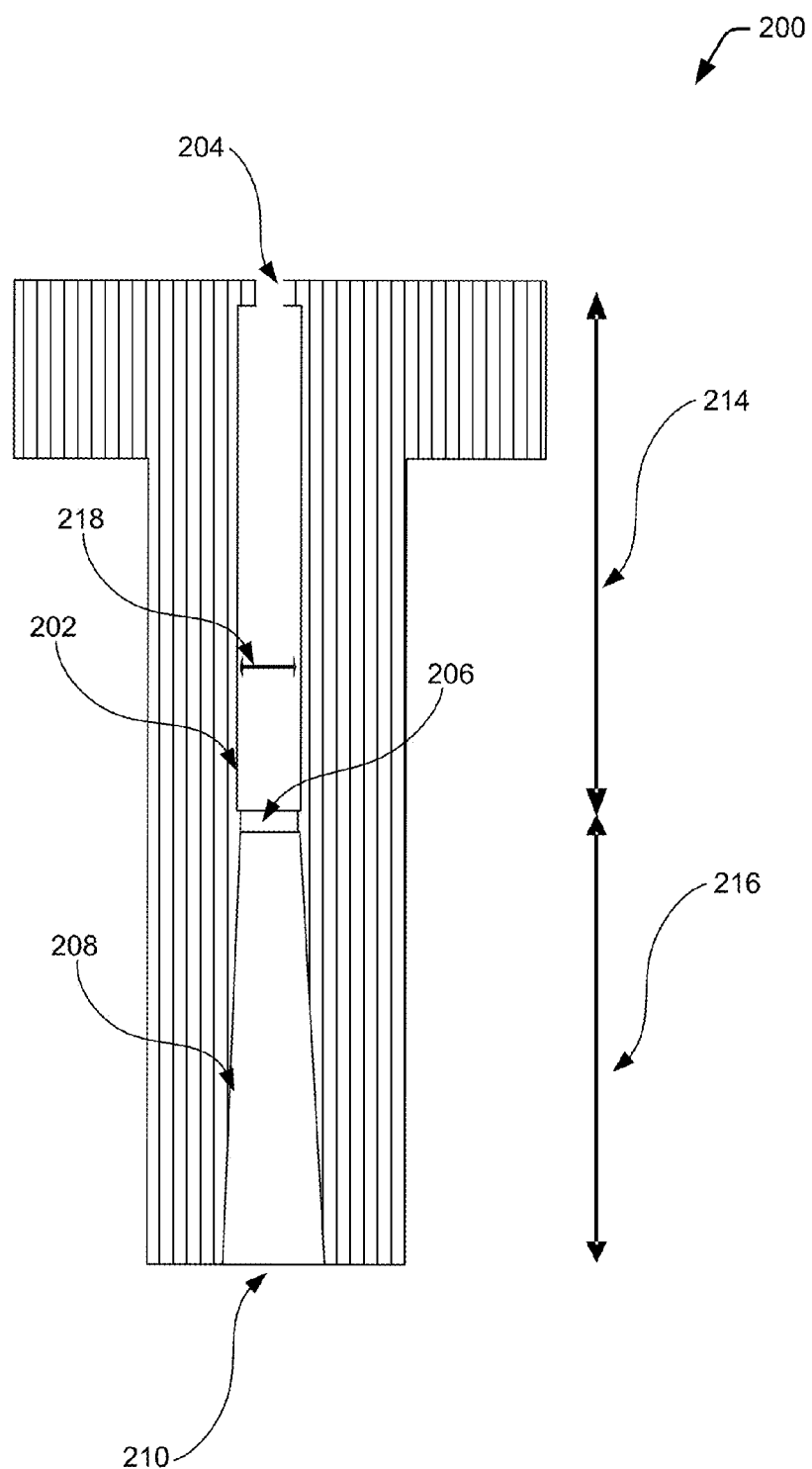

FIG. 2B illustrates another embodiment 220 of the TGS nozzle 200 that includes a reservoir component 202 with a diameter 218 that is about the same size as the transition orifice 206. In this embodiment, the diameter 218 may be between 2 mm to 5 mm with a length 214 similar to the FIG. 2A embodiment. The FIG. 2B embodiment may reduce the pressure difference between the reservoir component 202 and the outlet component 208 and may improve the stability of the fluid mixture during the first stage of the TGS nozzle 200. However, in other embodiments, a single stage nozzle 300 may be used to reduce the pressure fluctuations in the TSG nozzle 200 embodiment and may reduce the turbulence of the fluid mixture.

Figure 3:
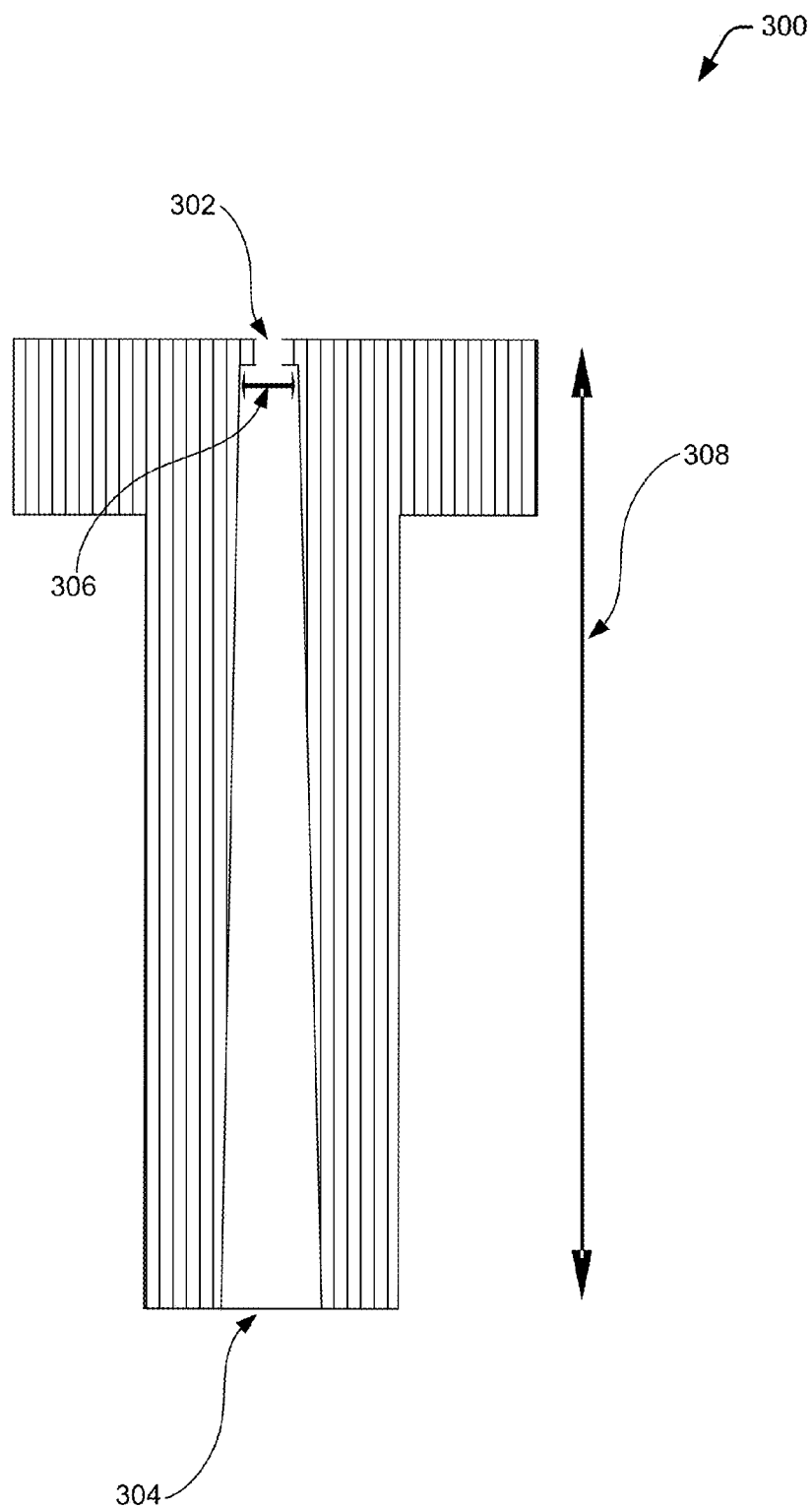
FIG. 3 includes a cross-section illustration of a single stage gas nozzle according to at least one embodiment of the disclosure.

FIG. 3 illustrates a cross-section illustration of one embodiment of a single stage gas (SSG) nozzle 300 that may incorporate a single expansion chamber between the inlet orifice 302 and the outlet orifice 304. The SSG nozzle 300 expansion chamber may vary, but in the FIG. 3 embodiment illustrates a conical design that may have an initial diameter 306 (e.g., 1.5 mm-3 mm) that may be slightly larger than the inlet orifice 302 (e.g., 0.5 mm-1.5 mm). The conical design may include a half angle between 3° and 10°, but preferably between 3° and 6°. The half angle may be the angle between an imaginary center line through expansion chamber of the SSG nozzle 300 (from the inlet orifice 302 and outlet orifice 304) and the sidewall of the expansion chamber (e.g., conical wall). Lastly, the SSG nozzle 300 may have length between 18 mm and 40 mm, preferably between 18 mm and 25 mm. Another variation of the SSG nozzle 300 may include a continuous taper of the expansion volume from the inlet orifice 302 to the outlet orifice 304, as illustrated in FIG. 4.

Figure 4:
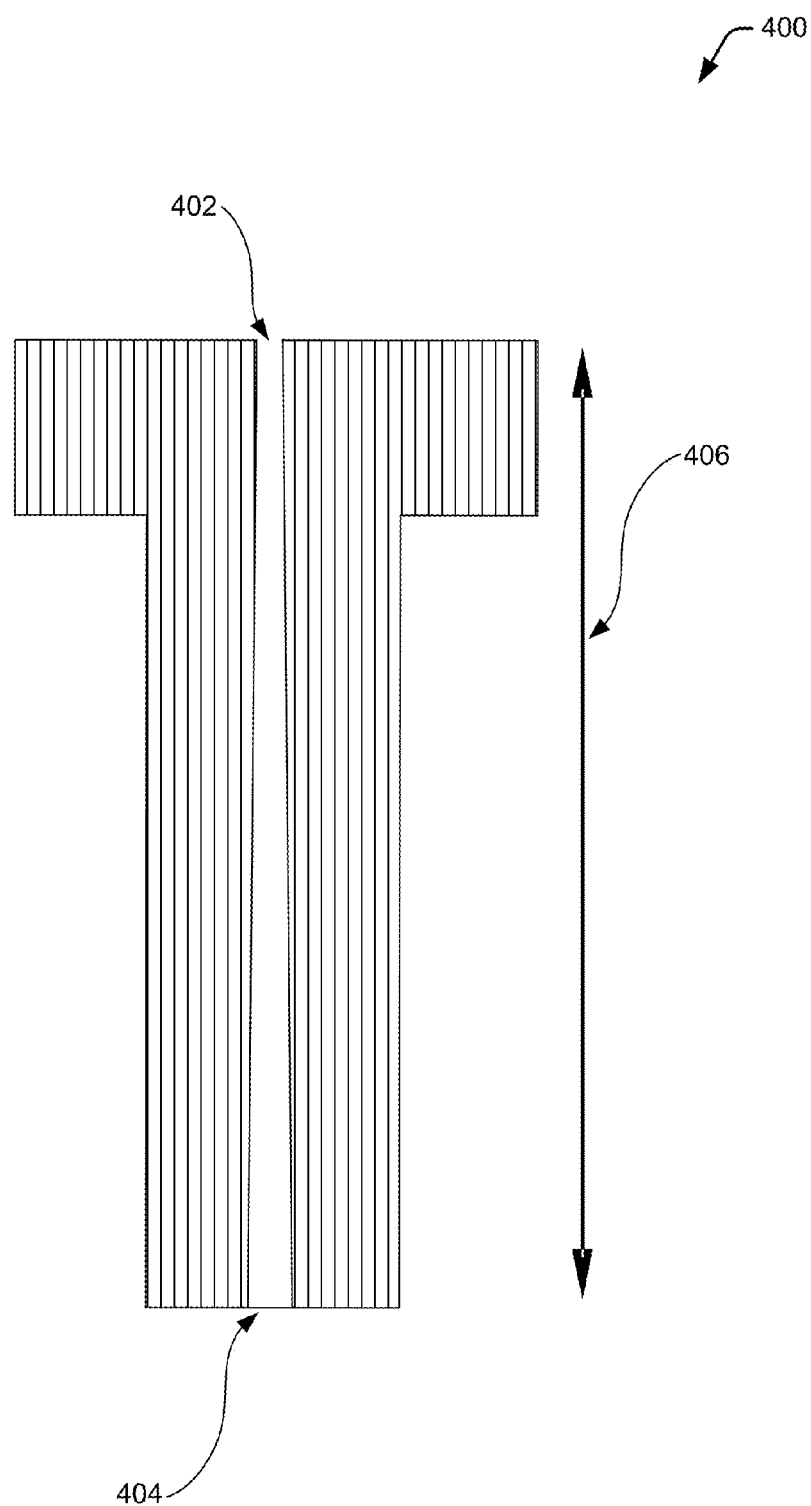
FIG. 4 includes a cross-section illustration of a flush gas nozzle according to at least one embodiment of the disclosure.

FIG. 4 includes a cross-section illustration of a flush gas (FG) nozzle 400 that may include a continuous expansion chamber that does not include any offsets or constrictions between the inlet orifice 402 and the outlet orifice 404. As the name suggests, the initial diameter of the expansion volume may be flush with the inlet diameter 402, which may be between 0.5 mm to 3 mm, but preferably between 1 mm and 1.5 mm. In one embodiment, the outlet diameter 404 may be between 2 mm and 12 mm, but preferably between two times to four times the size of the inlet diameter 402. Further, the half angle may be between 3° and 10°, but preferably between, but preferably between 3° and 6°. The length 406 of the expansion volume should vary between 10 mm and 50 mm between the inlet orifice 402 and the outlet orifice 404. Additionally, the following embodiments may apply to both the FIG. 3 and FIG. 4 embodiments. In one specific embodiment, the nozzle may have conical length of 20 mm, a half angle of 3° and an outlet orifice diameter of about 4 mm. In another specific embodiment, the conical length may be between 15 mm and 25 mm with an outlet orifice diameter between 3 mm and 6 mm. In another specific embodiment, the outlet orifice diameter may be about 4 mm with an inlet diameter of about 1.2 mm and a conical length of about 35 mm.

Another feature that may impact the cleaning efficiency of the cleaning system 100 may be the distance between the nozzle outlet 404 and the microelectronic substrate 118. In some process embodiments, the gap distance may impact the cleaning efficiency not only by the amount of particles removed, but also the amount of surface area that the particles may be removed during a single pass across the substrate 118. In some instances, the aerosol spray or GCJ spray may be able to clean a larger surface area of the substrate 118 when the outlet orifice of the nozzle 110 may be closer (e.g., <50 mm) to the microelectronic substrate 119.

Figure 5:
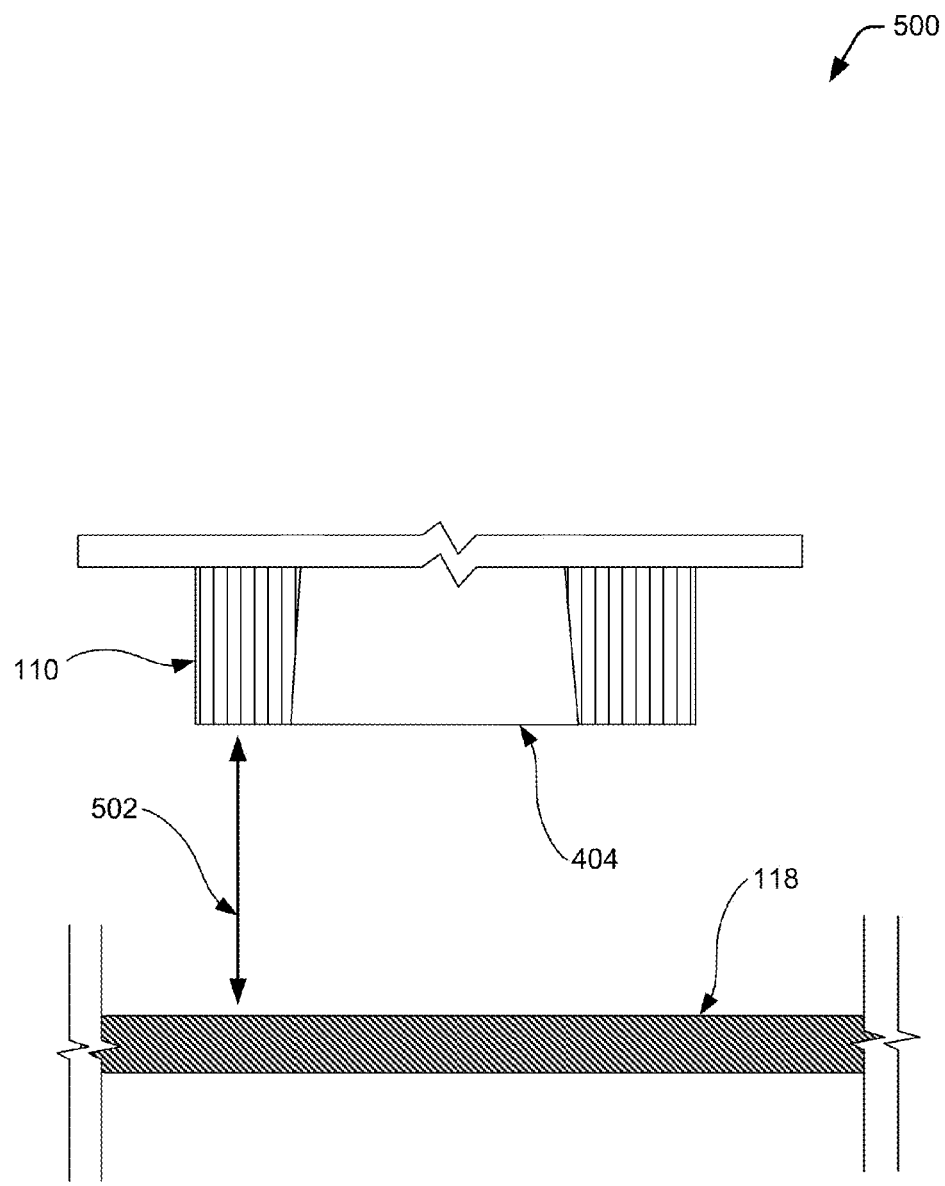
FIG. 5 includes an illustration of a gap distance between the gas nozzle and a microelectronic substrate according to at least one embodiment of the disclosure.

FIG. 5 includes an illustration 500 of a gap distance 502 between the outlet orifice 404 of a nozzle 110 and the microelectronic substrate 118 according to at least one embodiment of the disclosure. In one instance, the gap distance 502 may be measured from the end of the nozzle 110 assembly that forms the structure or support for the nozzle 110. In another instance, the gas distance 502 may be measured from a plane that extends across the largest diameter of the conical expansion region that is exposed to the microelectronic substrate 118.

The gap distance 502 may vary depending on the chamber pressure, gas composition, fluid mixture temperature, inlet pressure, nozzle 110 design or some combination thereof. Generally, the gap distance 502 may be between 2 mm and 50 mm. Generally, the vacuum chamber 120 pressure may be at less than 35 Torr to operate within the 2 mm and 50 mm gap distances 502. However, when the chamber pressure may be at less than 10 Torr and the gas nozzle 110 has an outlet orifice less than 6 mm, the gap distance 502 may be optimized to be less than 10 mm. In some specific embodiments, a desirable gap distance 502 may be about 5 mm for a nozzle 110 that has an outlet diameter less than 5 mm and the vacuum chamber 120 pressure being at less than 10 Torr.

In other embodiments, the gap distance 502 may be based, at least in part, on an inverse relationship with the vacuum chamber 120 pressure. For example, the gap distance 502 may be less than or equal to a value derived by dividing a constant value by the chamber 120 pressure. In one embodiment, the constant may be a dimensionless parameter or in units of mm*Torr and the vacuum chamber 120 pressure may be measured in Torr, see equation 1:

$$\text{Gap Distance} < 1 = \text{Constant}/\text{Chamber Pressure} \quad (1)$$

In this way, the value obtained by dividing the constant by the chamber pressure provides a gap distance 502 that may be used for the cleaning process. For example, in one specific embodiment, the constant may be 50 and the chamber pressure may be about 7 Torr. In this instance, the gap distance would be less than or about 7 mm under the equation (1). In other embodiments, the constant may range between 40 and 60 and the pressure may range from 1 Torr to 10 Torr. In another embodiment, the constant may range between 0.05 to 0.3 and the pressure may range from 0.05 Torr to 1 Torr. Although gap distance 502 may have a positive impact on cleaning efficiency, there are several other process variables that can contribute to cleaning efficiency using aerosol spray and gas cluster jet spray.

The hardware described in the descriptions of FIGS. 1-5 may be used to enable the aerosol spray and gas cluster jet (GCJ) spray with slight variations in hardware and more substantive changes for process conditions. The process conditions may vary between different fluid mixture compositions and ratios, inlet pressures, inlet temperatures, or vacuum chamber 120 pressures. One substantive difference between the aerosol spray and the GCJ spray processes may be the phase composition of the incoming fluid mixtures to the nozzle 110. For example, the aerosol spray fluid mixture may have a higher liquid concentration than the GCJ fluid mixture, which may exist in gaseous state with very little or no liquid in the incoming GCJ fluid mixture to the nozzle 110.

In the aerosol spray embodiment, the temperature in the cryogenic cooling system 108 may be set to a point where at least a portion of the incoming fluid mixture to the nozzle 110 may exist in a liquid phase. In this embodiment, the nozzle mixture may be at least 10% by weight in a liquid state. The liquid/gas mixture is then expanded at a high pressure into the process chamber 104 where the cryogenic aerosols may be formed and may include a substantial portion of solid and/or liquid particles. However, the state of the fluid mixtures may not be the sole difference between the aerosol and GCJ processes, which will be described in greater detail below.

In contrast, the incoming GCJ spray fluid mixture to the nozzle 110 may contain very little (e.g., <1% by volume) or no liquid phase and may be in a completely gaseous state. For example, the temperature in the cryogenic cooling system 108 may be set to a point that prevents the fluid mixture from existing in a liquid phase for the GCJ cleaning process. Accordingly, phase diagrams may be one way to determine the process temperatures and pressures that may be used to enable the formation of an aerosol spray or GCJ spray in the process chamber 104.

Figure 6A:
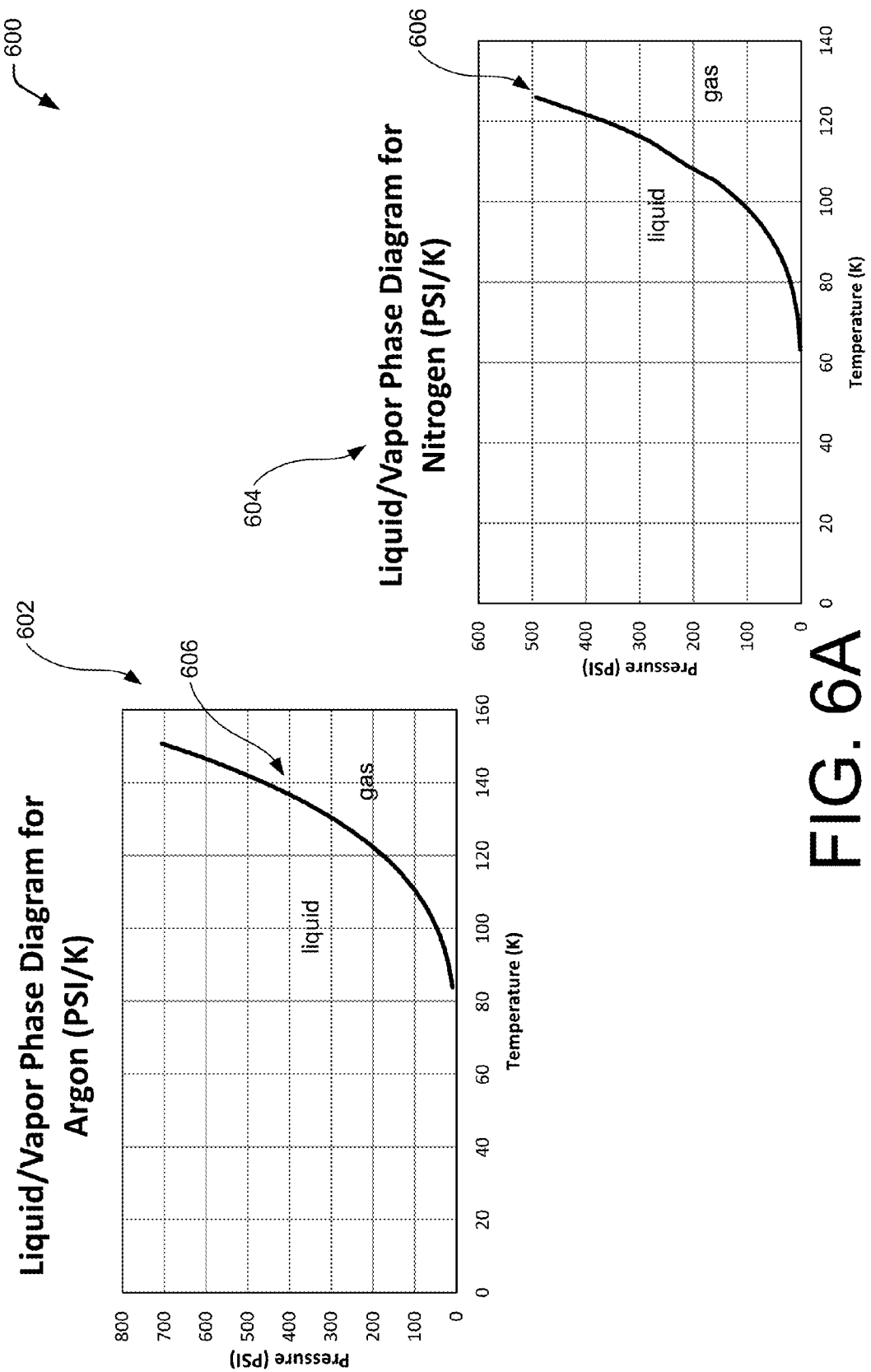
FIGS. 6A-6B includes illustrations of phase diagrams providing an indication of the process conditions that may maintain a cryogenic fluid in a liquid state or a gas state according to at least one embodiment of the disclosure.
Figure 6B:
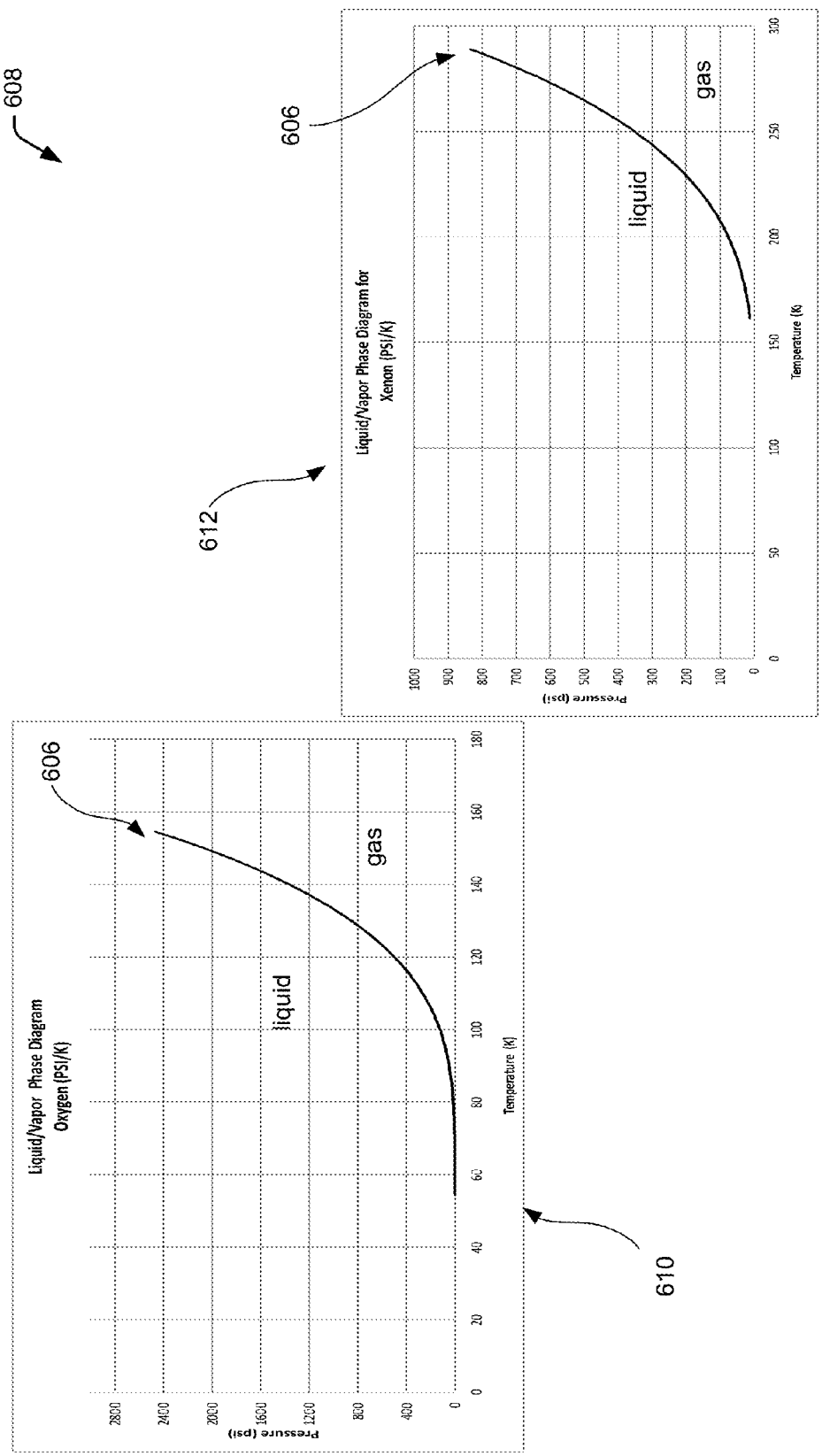

Turning to FIGS. 6A-6B, the phase diagrams 600, 608 may indicate which phase the components of the incoming fluid mixture may exist or more likely to include a liquid phase, gas phase, or a combination thereof. An argon phase diagram 602, a nitrogen phase diagram 604, an oxygen phase diagram 610, and a xenon phase diagram 612 illustrated for the purposes of explanation and illustration of exemplary phase diagrams. A person of ordinary skill in the art may be able to find phase diagram information in the literature or via the National Institutes of Standards and Technology of Gaithersburg, Md. or other sources. The other chemicals described herein may also have a representative phase diagrams, but are not shown here for the purposes of ease of illustration.

The phase diagrams 600, 608 may be represented by a graphical representation that highlights the relationship between pressure (e.g., y-axis) and temperature (e.g., x-axis) and the likelihood that the element may exist in a gaseous or liquid state. The phase diagrams may include a gas-liquid phase transition line 606 (or a vapor-liquid transition line) that may represent where the element may transition between a liquid state or a gaseous state. In these embodiments, the liquid phase may be more likely to be present when the pressure and temperature of the elements are to the left of the gas-liquid transition line 606 and the gaseous phase may predominate when the pressure and temperature of the elements are to the right of the gas-liquid transition line 606. Further, when the pressure and temperature of the element is very close to the gas-liquid phase transition line 606, the likelihood that the element may exist in a gas and liquid phase is higher than when the pressure and temperature may be further away from the gas-liquid phase transition line 606. For example, in view of the argon phase diagram 602, when argon is held at a pressure of 300 psi at a temperature of 100K the argon is more likely to include portion that is in the liquid phase or have a higher concentration (by weight) of liquid than when the argon is maintained at a pressure of 300 psi at a temperature of 130K. The liquid concentration of argon may increase as the temperature decreases from 130K while maintaining a pressure of 300 psi. Likewise, the argon liquid concentration may also increase when the pressure increases from 300 psi while maintaining a temperature of 130K. Generally, per the phase diagrams 600, to maintain argon in a gaseous state, the temperature should be above 83K and to maintain nitrogen in a gaseous state the temperature should be above 63K. However, the phase of any nitrogen-argon mixture may be dependent upon the relative concentration of the elements, as well as the pressure and temperature of the fluid mixture. However, the phase diagrams 600 may be used as guidelines that may provide an indication of the phase of the argon-nitrogen fluid mixture or at least the likelihood that liquid may be present. For example, for an aerosol cleaning process the incoming fluid mixture may have a temperature or pressure that may on or to the left of the gas-liquid transition line 606 for one or more of the elements of the incoming fluid mixture. In contrast, a GCJ cleaning process may be more likely to use an incoming fluid mixture that may have a pressure and temperature that may be to the right of the gas-liquid phase transition line 606 for one or more of the elements in the GCJ incoming fluid mixture. In some instances, the system 100 may alternate between an aerosol process and a GCJ process by varying the incoming temperature and/or pressure of the fluid mixture.

It should be noted that the gas-liquid phase transition line 606 are similar to each of the phase diagrams 600, 608, however their values may be unique to the chemical assigned to each of the phase diagrams 600, 608, but the phase diagrams 600, 608 may be used by a person of ordinary skill in the art as described in the explanation of the argon phase diagram 602. A person of ordinary skill in the art may use the phase diagrams 600, 608 to optimize the amount of liquid and/or gas in the fluid mixture of the aerosol or GCJ sprays.

A cryogenic aerosol spray may be formed with a fluid or fluid mixture being subjected to cryogenic temperatures at or near the liquefying temperature of at least one of the fluids and then expanding the fluid mixture through the nozzle 110 into a low pressure environment in the process chamber 104. The expansion conditions and the composition of the fluid mixture may have a role in forming small liquid droplets and/or solid particles which comprise the aerosol spray that may impinge the substrate 118. The aerosol spray may be used to dislodge microelectronic substrate 118 contaminants (e.g., particles) by imparting sufficient energy from the aerosol spray (e.g., droplets, solid particles) to overcome the adhesive forces between the contaminants and the microelectronic substrate 118. The momentum of the aerosol spray may play an important role in removing particles based, at least in part, on the amount of energy that may be needed to the aforementioned adhesive forces. The particle removal efficiency may be optimized by producing cryogenic aerosols that may have components (e.g., droplets, crystals, etc.) of varying mass and/or velocity. The momentum needed to dislodge the contaminants is a function of mass and velocity. The mass and velocity may be very important to overcome the strong adhesive forces between the particle and the surface of the substrate, particularly when the particle may be very small (<100 nm).

Figure 7:
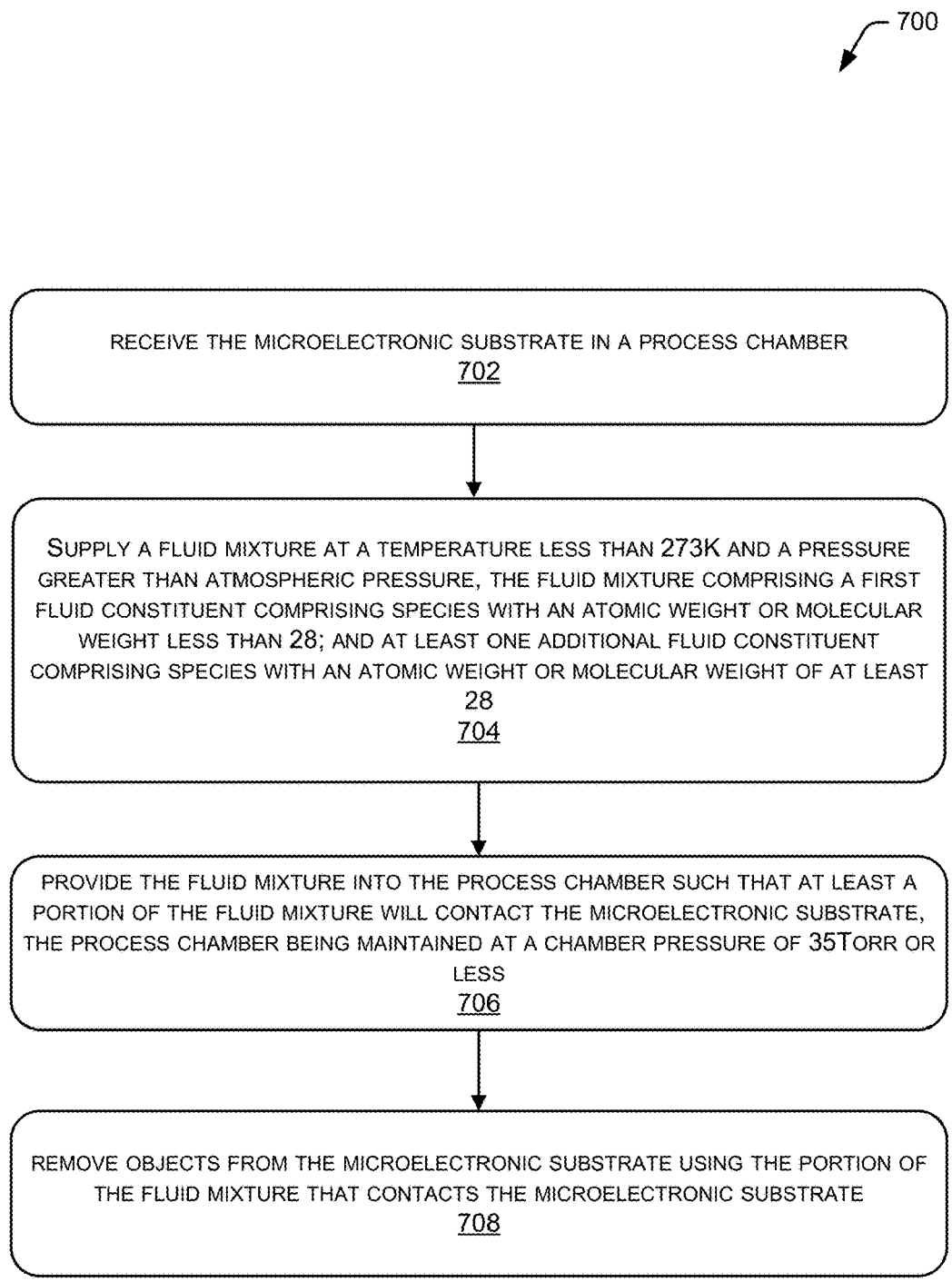
FIG. 7 includes a flow chart presenting a method of treating a microelectronic substrate with a fluid according to various embodiments.

FIG. 7 illustrates a flow chart 700 for a method of treating a microelectronic substrate 118 with a cryogenic aerosol to remove particles. As noted above, one approach to improving particle removal efficiency may be to increase the momentum of the aerosol spray. Momentum may be the product of the mass and velocity of the aerosol spray contents, such that the kinetic energy may be increased by increasing mass and/or velocity of the components of the aerosol spray. The mass and/or velocity may be dependent upon a variety of factors that may include, but are not limited to, fluid mixture composition, incoming fluid mixture pressure and/or temperature, and/or process chamber 104 temperature and/or pressure. The flow chart 700 illustrates one embodiment that optimizes momentum by using a various combinations of nitrogen and/or argon and at least one other a carrier gas.

Turning to FIG. 7, at block 702, the system 100 may receive the microelectronic substrate 118 in a process chamber 104. The microelectronic substrate 118 may include a semiconductor material (e.g., silicon, etc.) that may be used to produce an electronic devices that may include, but are not limited to, memory devices, microprocessor devices, light emitting displays, solar cells and the like. The microelectronic substrate 118 may include patterned films or blanket films that may include contamination that may be removed by an aerosol cleaning process implemented on the system 100. The system 100 may include the process chamber 104 that may be in fluid communication with a cryogenic cooling system 108 and one or more fluid sources 106. The process chamber may also include a fluid expansion component (e.g., TSG nozzle 200, etc.) that may be used to expand a fluid mixture to form the aerosol spray to clean the microelectronic substrate 118.

At block 704, the system 100 may supply a fluid mixture to a fluid expansion component via the cryogenic cooling system 108 that may cool the fluid mixture to less than 273K. In one embodiment, the temperature of the fluid mixture may be greater than or equal to 70K and less than or equal to 200K, more particularly the temperature may be less than 130K. The system 100 may also maintain the fluid mixture at a pressure greater than atmospheric pressure. In one embodiment, the fluid mixture pressure may be maintained between 50 psig and 800 psig.

In one embodiment, the fluid mixture may include a first fluid constituent comprising molecules with an atomic weight less than 28 and at least one additional fluid constituent comprising molecules with an atomic weight of at least 28. A person of ordinary skill in the art would be able to optimize the fluid mixture of two or more fluids to achieve a desired momentum for the aerosol spray components to maximize particle removal efficiency or to target different types or sizes of particles. In this instance, the first fluid constituent may include, but is not limited to, helium, neon or a combination thereof. The at least one additional fluid constituent may include, but is not limited to, nitrogen ($N_2$), argon, krypton, xenon, carbon dioxide, or a combination thereof. In one specific embodiment, the additional fluid constituent comprises an $N_2$ and argon mixture and the first fluid constituent may include helium. However, the temperature, pressure and concentration of the fluid mixture may vary to provide different types of aerosol sprays. In other embodiments, the phase or state of the fluid mixture, which may include, gas, liquid, gas-liquid at various concentrations that will be described below.

The ratio between the first fluid constituent and the additional fluid constituents may vary depending on the type of spray that may be desired to clean the microelectronic substrate 118. The fluid mixture may vary by chemical composition and concentration and/or by phase or state of matter (e.g., gas, liquid, etc.). In one aerosol embodiment, the first fluid constituent may comprise at least 50% by weight of the fluid mixture that may include a first portion in a gaseous state and a second portion in a liquid state. In most instances, the fluid mixture may have be least 10% by weight being in a liquid phase. The fluid mixture may be optimized to address different types and/or size of particles that may be on patterned or patterned microelectronic substrates 118. One approach to alter the particles removal performance may be to adjust the fluid mixture composition and/or concentration to enhance particle removal performance. In another fluid mixture embodiment, the first fluid constituent comprises between 10% and 50% by weight of the fluid mixture. In another embodiment, the first fluid constituent may include between 20% and 40% by weight of the fluid mixture. In another fluid mixture embodiment, the first fluid constituent may include between 30% and 40% by weight of the fluid mixture. The phase of the aforementioned aerosol fluid mixtures may also vary widely to adjust for different types of particles and films on the substrate 118. For example, the fluid mixture may include a first portion that may be in a gaseous state and a second portion that may be in a liquid state.

In one embodiment, the second portion may be at least 10% by weight of the fluid mixture. However, in certain instances, a lower concentration of liquid may be desirable to remove particles. In the lower liquid concentration embodiment, the second portion may be no more than 1% by weight of the fluid mixture. The liquid portion of the fluid mixture may include liquid phases or one or more gases that may comprise the fluid mixture. In these fluid mixture embodiments, the system 110 may implement the aerosol spray by flowing between 120 slm and 140 slm of the additional fluid constituent and 30 slm and 45 slm of the first fluid constituent.

In addition to incoming pressure, concentration, and composition of the fluid mixture, the momentum and composition of the aerosol spray may also be impacted by the pressure in the process chamber 102. More specifically, the chamber pressure may impact the mass and/or velocity of the liquid droplets and/or solid particles in the aerosol spray. The expansion of the fluid mixture may rely on a pressure difference across the nozzle 110.

At block 706, the system 100 may provide the fluid mixture into the process chamber 104 such that at least a portion of the fluid mixture will contact the microelectronic substrate 118. The expansion of the fluid mixture via the fluid expansion component (e.g., nozzle 110) may form the liquid droplets and/or solid particles of the aerosol spray. The system 100 may maintain the process chamber 104 at a chamber pressure of 35 Torr or less. In certain instances, it may be desirable to maintain the process chamber 104 at much lower pressure to optimize the mass and/or velocity of the liquid droplets and/or solid particles in the aerosol spray. In one specific embodiment, particle removal characteristics of the aerosol spray may be more desirable for certain particles when the process chamber is maintained at less than 10 Torr. It was also noted, the particle removal efficiency covered a larger surface area when the process chamber 104 is maintained at less than 5 Torr during fluid mixture expansion.

When the fluid mixture flows through the fluid expansion component the fluid mixture may undergo a phase transition related to the expansion of the fluid mixture from a relatively high pressure (e.g., >atmospheric pressure) to a relatively low pressure (e.g., <35 Torr). In one embodiment, the incoming fluid mixture may exist in a gaseous or liquid-gas phase and be under relatively higher pressure than the process chamber 102. However, when the fluid mixture flows through or expands into the low pressure of the process chamber 104, the fluid mixture may begin to transition to form liquid droplets and/or a solid state as described above. For example, the expanded fluid mixture may comprises a combination of portions in a gas phase, a liquid phase, and/or a solid phase. This may include what may be referred to above a cryogenic aerosol. In yet another embodiment, the fluid mixture may also include a gas cluster. In one embodiment, may be an agglomeration of atoms or molecules by weak attractive forces (e.g., van der Waals forces). In one instance, gas clusters may be considered a phase of matter between gas and solid the size of the gas clusters may range from a few molecules or atoms to more than $10^5$ atoms.

In one more embodiment, the fluid mixture may transition between aerosol and gas clusters (e.g., GCJ) in same nozzle while treating the same microelectronic substrate 118. In this way, the fluid mixture may transition between an aerosol and GCJ by going from higher liquid concentration to a lower liquid concentration in the fluid mixture. Alternatively, the fluid mixture may transition between the GCJ and the aerosol by going from lower liquid concentration to a higher liquid concentration in the fluid mixture. As noted above in the description of FIG. 6A-6B, the liquid phase concentration may be controlled by temperature, pressure or a combination thereof. For example, in the aerosol to GCJ transition the fluid mixture liquid concentration may transition from 10% by weight to less than 1% by weight, in one specific embodiment. In another specific embodiment, the GCJ to aerosol transition may occur when the fluid mixture's liquid concentration transitions from 1% by weight to less than 10% by weight. However, the transition between aerosol and GCJ, and vice versa, may not be limited percentages in the aforementioned specific embodiments and are merely exemplary for the purposes of explanation and not limitation.

At block 708, the expanded fluid may be directed towards the microelectronic substrate 118 and may remove particles the microelectronic substrate 118 as the fluid expansion component moves across the surface of the microelectronic substrate 118. In some embodiments, the system 100 may include a plurality of fluid expansion components that may be arranged around the microelectronic substrate 118. The plurality of fluid expansion components may be used concurrently or serially to remove particles. Alternatively, some of the fluid expansion components may be dedicated to aerosol processing and the remaining fluid expansion components may be used for GCJ processing.

In addition to aerosol processing, microelectronic substrates 118 may also be cleaned using GCJ processing. Cryogenic gas clusters may be formed when a gaseous species, such as argon or nitrogen or mixtures thereof, is passed through a heat exchanger vessel, such as a dewar (e.g., cryogenic cooling system 108), that subjects the gas to cryogenic temperatures that may be above the liquification temperature of any of the gas constituents. The high pressure cryogenic gas may then be expanded through a nozzle 110 or an array of nozzles angled or perpendicular with respect to the surface of the microelectronic substrate 118. The GCJ spray may be used to remove particles from the surface of the semiconductor wafer without causing any damage or limiting the amount of damage to the microelectronic substrate's 118 surface.

Gas clusters, which may be an ensemble or aggregation of atoms/molecules held together by forces (e.g., van der waals forces), are classified as a separate phase of matter between atoms or molecules in a gas and the solid phase and can range in size from few atoms to $10^5$ atoms. The Hagena empirical cluster scaling parameter ($\Gamma^*$) given in Equation (2), provides the critical parameters that may affect cluster size. The term k is condensation parameter related to bond formation (a gas species property); d is the nozzle orifice diameter, a is the expansion half angle and $P_o$ and $T_o$ are the pre-expansion pressure and temperature respectively. Nozzle geometries that have a conical shape help constrain the expanding gas and enhance the number of collisions between atoms or molecules for more efficient cluster formation. In this way, the nozzle 110 may enhance the formation of clusters large enough to dislodge contaminants from the surface of the substrate 118. The GCJ spray emanating from the nozzle 110 may not be ionized before it impinges on the substrate 118 but remains as a neutral collection of atoms.

$$\Gamma^* = k \frac{\left(\frac{d}{\tan\alpha}\right)^{0.85}}{T_o^{2.29}} P_o \quad (2)$$

The ensemble of atoms or molecules that comprise the cluster may have a size distribution that can provide better process capability to target cleaning of contaminants of sizes less than 100 nm due to the proximity of the cryogenic cluster sizes to the contaminant sizes on the microelectronic substrate 118. The small size of the cryogenic clusters impinging on the microelectronic substrate 118 may also prevent or minimize damaging of the microelectronic substrate 118 which may have sensitive structures that need to be preserved during the treatment.

As with the aerosol process, the GCJ process may use the same or similar hardware described in description of the system 100 of FIG. 1 and its components described in the description in FIGS. 2-5. However, the implementation of the GCJ methods are not limited to the hardware embodiments described herein. In certain embodiments, the GCJ process may use the same or similar process conditions as the aerosol process, but the GCJ process may have a lower liquid phase concentration for the fluid mixture. However, the GCJ processes are not required to have a lower liquid concentration than all of the aerosol process embodiments described herein. A person of ordinary skill in the art may implement a GCJ process that increases the amount or density of gas clusters relative to any liquid droplets and/or solid particles (e.g., frozen liquid) that may exist in the GCJ methods described herein. Those GCJ methods may have several different techniques to optimize the cleaning process and a person of ordinary skill in the art may use any combination of these techniques to clean any microelectronic substrate 118. For example, a person of ordinary skill in the art may vary the nozzle 110 design and/or orientation, the fluid mixture's composition, concentration or composition, the fluid mixture's incoming pressure and/or temperature and the process chamber's 104 pressure and/or temperature to clean microelectronic substrates 118.

Figure 8:
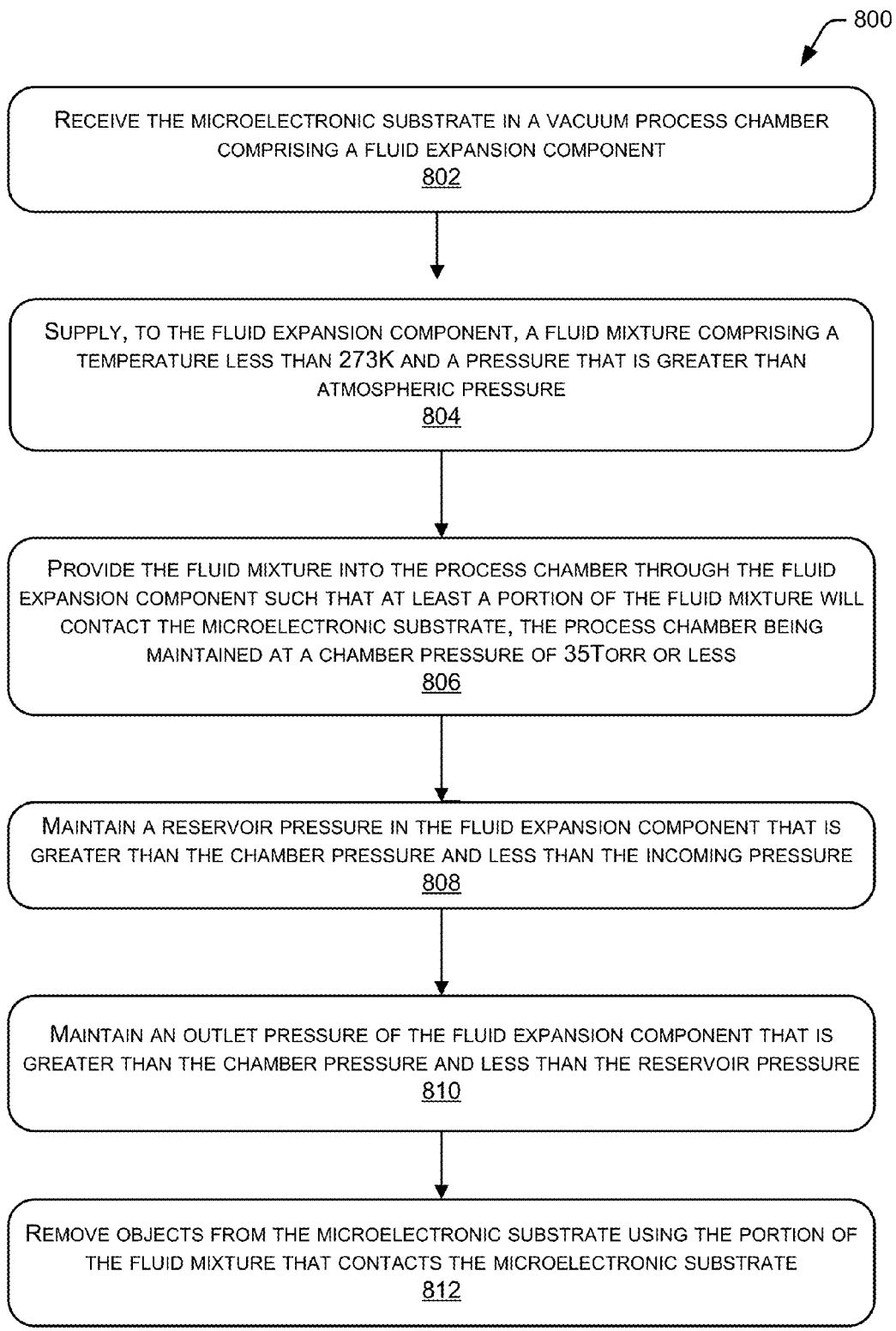
FIG. 8 includes a flow chart presenting another method of treating a microelectronic substrate with a fluid according to various embodiments.

FIG. 8 provides a flow chart 800 for a cryogenic method for generating a GCJ process to remove particles from a microelectronic substrate 118. In this embodiment, the method may be representative of a GCJ process that may use a multi-stage nozzle 100, similar to the two-stage gas (TSG) nozzle 200 described herein in the description of FIGS. 2A-2B. The FIG. 8 embodiment may reflect the pressure differences or changes of the fluid mixture as it transitions from a high pressure environment to a low pressure environment through the multi-stage nozzle 110.

Turning to FIG. 8, at block 802, the system 100 may receive the microelectronic substrate 118 in a vacuum process chamber 104 that may include a fluid expansion component (e.g., TSG nozzle 200). The system may place the process chamber 104 to sub-atmospheric condition prior to exposing the microelectronic substrate 118 to any fluid mixtures provided by the cryogenic cooling system 108.

At block 804, the system 100 may supply or condition the fluid mixture to be at a temperature less than 273K and a pressure that may be greater than atmospheric pressure. For example, the fluid mixture temperature may be between 70K and 200K or more particularly between 70K and 120K. The fluid mixture pressure may be between 50 psig and 800 psig. In general, at least a majority (by weight) of the fluid mixture may be in the gas phase. However, in other embodiments, the fluid mixture may be less than 10% (by weight) in the gas phase, and more particularly may be less than 1% (by weight) in the gas phase.

The fluid mixture may be a single fluid composition or a combination of fluids that may include, but are not limited to, $N_2$, argon, xenon, helium, neon, krypton, carbon dioxide or any combination thereof. A person of ordinary skill in the art may choose one or more combinations of the aforementioned fluids to treat the substrate using one fluid mixture at a time or a combination of fluid mixtures for the same microelectronic substrate 118.

In one embodiment, the fluid mixture may include a combination of $N_2$ and argon at a ratio between 1:1 and 11:1. A person of ordinary skill in the art may optimize the ratio in conjunction with the liquid concentration of the $N_2$ and/or the argon to remove particles from the microelectronic substrate 118. However, in other embodiments, a person of ordinary skill in the art may also optimize the energy or momentum of the GCJ fluid mixture to optimize particle removal efficiency. For example, the fluid mixture may include another carrier gas that may alter the mass and/or velocity of the GCJ process. The carrier gases may include, but are not limited to, xenon, helium, neon, krypton, carbon dioxide or any combination thereof. In one embodiment, the fluid mixture may include a 1:1 to 4:1 mixture of N2 to argon that may be mixed one or more of the following carrier gases: xenon, krypton, carbon dioxide or any combination thereof. In other instances, the carrier gas composition and concentration may be optimized with different ratios of N2 and argon with different ratios of the carrier gases. In other embodiments, the carrier gases may be included based on the Hagena value, k as shown in Table 1.

TABLE 1

| Gas | | | | | | | | |
|---|---|---|---|---|---|---|---|---|
| $N_2$ | $O_2$ | $CO_2$ | $CH_4$ | He | Ne | Ar | Kr | Xe |
| k | 528 | 1400 | 3660 | 2360 | 3.85 | 1.85 | 1650 | 2890 | 5500 |

In general, for some embodiments, the lower the k value fluid should be equal or higher in concentration when being mixed with $N_2$, argon or a combination thereof. For example, when the carrier gases are mixed with $N_2$, argon, or a combination thereof (e.g., 1:1 to 4:1) the ratio between $N_2$, argon, or a combination thereof should be done using a ratio mixture of at least 4:1 when using xenon, helium, neon, krypton, carbon dioxide or any combination thereof with up to a ratio mixture of 11:1. In contrast, when helium or neon or combined with $N_2$, argon, or a combination thereof (e.g., 1:1 to 4:1). The ratio mixture may be at least 1:4 between $N_2$, argon, or a combination thereof (e.g., 1:1 to 4:1) and helium, neon or combination thereof. The aforementioned combinations of N2, argon and/or the carrier gases may also apply to the other aerosol and GCJ methods described herein.

At block 806, the system 110 may provide the fluid mixture to the fluid expansion component from the fluid source 106 and/or from the cryogenic cooling system 108. The system 100 may also maintain the process chamber 104 at a pressure less than 35 Torr. For example, the system 100 may use the vacuum system 134 to control the process chamber 104 pressure prior to or when the fluid mixture may be introduced to the process chamber 104. In some embodiments, the process chamber 104 pressure may between 5 Torr-10 Torr and in some embodiments the pressure may be less than 5 Torr.

The GCJ spray may be formed when the fluid mixture transitions between a higher pressure environment (e.g., upstream of the nozzle 110) and a low pressure environment (e.g., process chamber). In the FIG. 8 embodiment, the fluid expansion component may be the TSG nozzle 200 that may place the fluid mixture under at least two pressure changes or expansions prior to impinging the microelectronic substrate 118.

At block 808, the fluid mixture may expand through the inlet orifice 204 into the reservoir component 202 and achieve or maintain a reservoir pressure into the reservoir component 202 that is greater than the process chamber 104 pressure and less than the incoming pressure of the fluid mixture. Broadly, the reservoir pressure may be less than 800 psig and greater than or equal to 35 Torr. But, the reservoir pressure 202 may fluctuate due to the gas flow variations within the confined spaces illustrated in FIGS. 2A-2B.

The fluid mixture may proceed to the transition orifice 206 which may or may not be smaller than the diameter of the reservoir component 202. When the transition orifice 206 is smaller than the reservoir component 202 diameter, the fluid mixture may be compressed to a higher pressure when flowing to or through the transition orifice 206 into the outlet component 208 of the TSG nozzle 200.

At block 810, the fluid mixture may be maintained at an outlet pressure in the outlet component 210 of the fluid expansion component. The outlet pressure may be greater than the chamber pressure and less than the reservoir component 202 pressure. During the transition between the transition orifice 206 and the outlet orifice 210 the fluid mixture may expand and may form gas clusters as described above. The difference in pressure between the outlet component 210 and the process chamber 102 may be due to the smaller confined volume of the outlet component 210 compared to the larger volume of the process chamber 104.

The gas clusters may be directed towards the outlet orifice 210 and the fluid mixture may continue to expand after the fluid mixture exits the TSG nozzle 200. However, the momentum may direct at least a majority of the gas cluster spray towards the microelectronic substrate 118. As noted above, the size of the gas cluster may vary between a few atoms up to $10^5$. The process may be optimized to control the number of gas clusters and their size by varying by the aforementioned process conditions. For example, a person of ordinary skill in the art may alter the incoming fluid mixture pressure, fluid mixture composition/concentration, process chamber 102 pressure or any combination thereof to remove particles from the microelectronic substrate 118.

At block 812, the components of the GCJ spray may be used to kinetically or chemically remove objects or contaminants from the microelectronic substrate 118. The objects may be removed via the kinetic impact of the GCJ spray and/or any chemical interaction of the fluid mixture may have with the objects. However, the removal of the objects is not limited to the theories of kinetic and/or chemical removal and that any theory that may be used to explain their removal is applicable, in that the removal of the objects after applying the GCJ spray may be sufficient evidence for any applicable theory that may be used to explain the objects removal.

The relative position of the TSG nozzle 200 and the microelectronic substrate 118 may also be used to optimize object removal. For example, the angle of incidence of the GCJ spray may be adjusted by moving the TSG nozzle 200 between 0° and 90° between the surface of the of the microelectronic substrate 118 the plane of the outlet orifice 210. In one specific embodiment, the angle of incidence may be between 30° and 60° to remove objects based on the composition or pattern on the microelectronic substrate 118. Alternatively, the angle of incidence may be between 60° and 90°, and more particularly about 90°. In other embodiments, more than one nozzle 110 may be used to treat the microelectronic substrate 118 at similar or varying angles of incidence.

In the aforementioned removal embodiments, the microelectronic substrate 118 may also be translated and/or rotated during the removal process. The removal speed may be optimized to a desired dwell time of the GCJ spray over particular portions of the microelectronic substrate 118. A person of ordinary skill in the art may optimize the dwell time and GCJ spray impingement location to achieve a desired particle removal efficiency. For example, a desirable particle removal efficient may be greater than 80% removal between pre and post particle measurements.

Similarly, the gap distance between the outlet orifice 210 and a surface of the microelectronic substrate 118 may be optimized to increase particle removal efficiency. The gap distance is described in greater detail in the description of FIG. 5, but generally the gap distance may be less than 50 mm.

The GCJ process may also be implemented using single stage nozzles 300, 400 similar to those described in the descriptions of FIGS. 3 & 4. The single stage nozzles 300, 400 may include a single expansion chamber that may be continuous, in that the diameter 306 of the expansion region is the same or increasing between the inlet orifice 302 and the outlet orifice 304. For example, the single stage nozzles 300, 400 may not have a transition orifice 206 like the TSG nozzle 200. However, the single stage GCJ methods may also be used by the TSG nozzle 200 systems 100 and are not limited to single stage nozzle systems 100. Likewise, the methods described in the descriptions of FIGS. 9-12 may also be used by single stage nozzles 300, 400.

Figure 9:
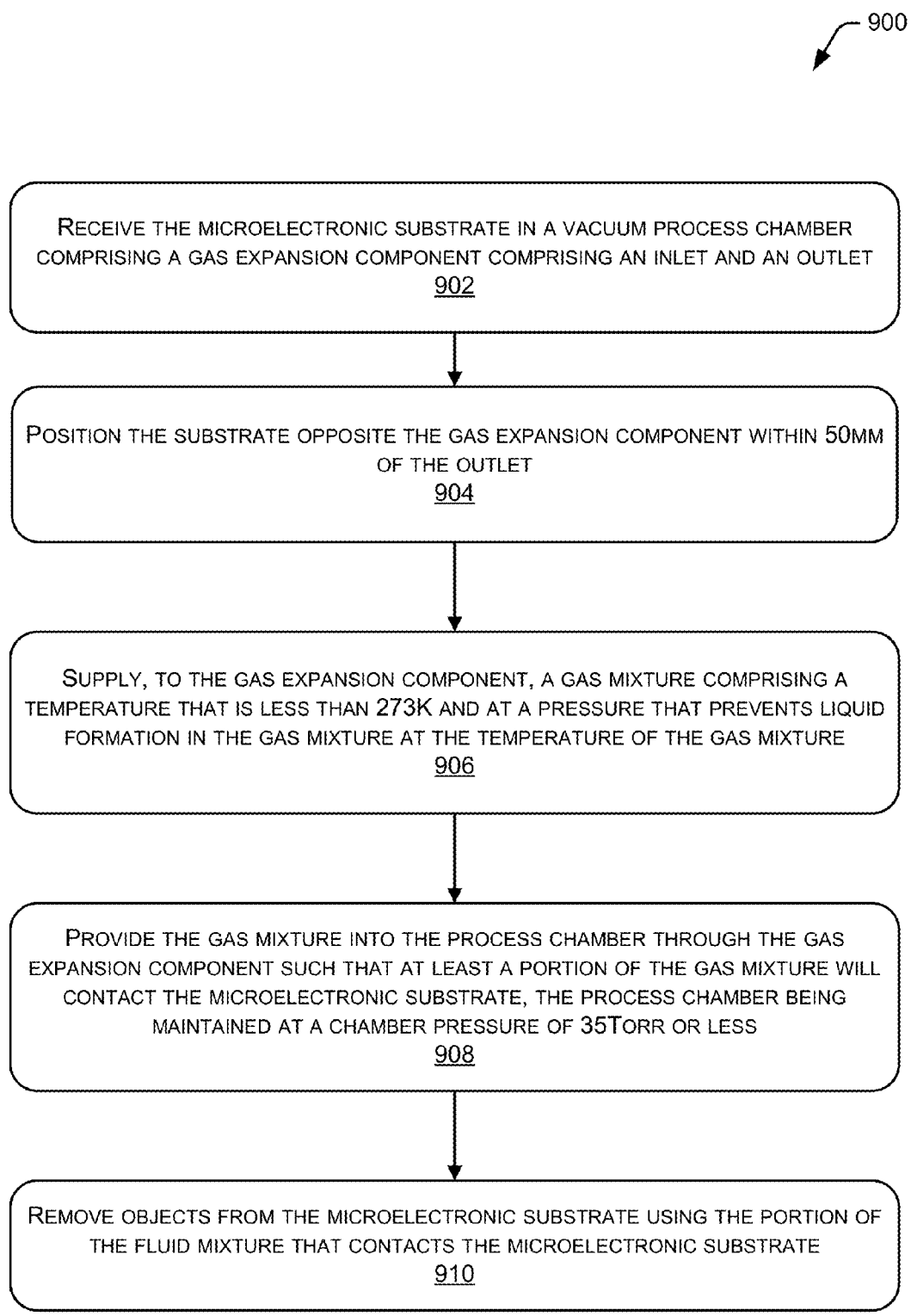
FIG. 9 includes a flow chart presenting another method of treating a microelectronic substrate with a fluid according to various embodiments.

FIG. 9 illustrates a flow chart 900 for another method of treating a microelectronic substrate 118 with a GCJ spray. The positioning of the nozzle 110, relative to the microelectronic substrate 118, may have a strong impact on the particle removal efficiency. Particularly, the gap distance between the outlet orifice 304 and a surface of the microelectronic substrate 118 may have an impact on particle removal efficiency. The gap distance may have influence on the fluid flow and distribution of the GCJ spray and may impact the size of cleaning surface area by the nozzle 110. In this way, the cycle time for GCJ process may be reduced due to fewer passes or lower dwell times for the nozzle 110.

Turning to FIG. 9, at block 902, the microelectronic substrate 118 may be received in the process chamber 104 that may include a gas expansion component (GEC) (e.g., nozzle 300, 400). The GEC may be any of the nozzles 110 described herein, but may particularly be configured the same or similar to the TSG nozzles 200, the SSG nozzle 300 or the Flush nozzle 400. Generally, the nozzles may include an inlet orifice 402 to receive the fluid mixture and an outlet orifice 404 that flows the fluid mixture into the process chamber 104.

At block 904, the system 100 may position the microelectronic substrate 118 opposite of the GEC, such that the outlet orifice 404 disposed above or adjacent to the microelectronic substrate 118. The GEC may be also be positioned at an angle relative to the surface of the microelectronic substrate 118. The surface being the portion where the microelectronic devices are manufactured. The angle may range between 0° and 90°. The GEC positioning may also be optimized based on the gap distance 502 as described in FIG. 5. The gap distance 502 may have an impact on the flow distribution towards and/or across the microelectronic substrate 118. As the gap distance 502 increases the cleaning surface area may decrease and may require additional nozzle passes to maintain or improve particle removal efficiency. The speed of the expanded fluid mixture may also vary depending on the gap distance 502. For example, the fluid flow laterally across the microelectronic substrate 118 may increase when the gap distance 502 is decreased. In some embodiments, the higher velocity may provide higher particle removal efficiency.

Generally, the GEC may likely be within 50 mm of the microelectronic substrate's 118 surface. But, in most embodiments, the gap distance 502 may be less than 10 mm for the aerosol or GCJ processes described herein. In one specific embodiment, the gap distance 502 may be about 5 mm prior to dispensing the fluid mixture through the GEC into the process chamber 104.

At block 906, the system 100 may supply the fluid mixture to the GEC at a temperature that may less than 273K and at a pressure that prevents liquid formation in the fluid mixture at the provided temperature of the fluid mixture. In this way, the liquid concentration within the fluid mixture may be non-existent or at least less than 1% by weight of the fluid mixture. A person of ordinary skill in the art of chemical processing may be able to use any known techniques to measure the liquid concentration of the fluid mixture. Further, the person of ordinary skill in the art may be able to select the proper combination of temperature and pressure using the phase diagrams 600, 608 or any other known phase diagram literature that may be available for a single species or a mixture of species.

In one embodiment, the temperature may be greater than or equal to 70K and less than 273K fluid mixture that may include nitrogen, argon, xenon, helium, carbon dioxide, krypton or any combination thereof. Likewise, the pressure may be selected using the phase diagrams 600, 608 or by any other known measurement technique that minimizes the amount of liquid concentration to less than 1% by weight in the fluid mixture. In most embodiments, the pressure may be less than or equal to 10 Torr, however in other embodiments, the pressure may be greater than 10 Torr to maximize particle removal efficiency.

At block 908, the system may provide the fluid mixture into the process chamber 104 through the GEC such that at least a portion of the fluid mixture will contact the microelectronic substrate 118. As noted above, the fluid mixture may expand from a relatively high pressure to a low pressure in the process chamber 104. In one embodiment, the process chamber 104 may be maintained at a chamber pressure of 35 Torr or less.

In one embodiment, the fluid mixture may include a combination of $N_2$ and argon at a ratio between 1:1 and 11:1, particularly at ratio less than 4:1. In other embodiments, the fluid mixture may include another carrier gas that may alter the mass and/or velocity of the GCJ spray. The carrier gases may include, but are not limited to, xenon, helium, neon, krypton, carbon dioxide or any combination thereof. In one embodiment, the fluid mixture may include a 1:1 to 4:1 mixture of $N_2$ to argon that may be mixed one or more of the following carrier gases: xenon, krypton, carbon dioxide or any combination thereof.

For example, when the carrier gases are mixed with $N_2$, argon, or a combination thereof (e.g., 1:1 to 4:1) the ratio between $N_2$ and argon, or a combination thereof should be done using a ratio mixture of at least 4:1 when using xenon, krypton, carbon dioxide or any combination thereof with up to a ratio mixture of 11:1. In contrast, when helium or neon or combined with $N_2$, argon, or a combination thereof (e.g., 1:1 to 4:1). The ratio mixture may be at least 1:4 between $N_2$, argon, or a combination thereof (e.g., 1:1 to 4:1) and helium, neon or combination thereof. The aforementioned combinations of N2, argon and/or the carrier gases may also apply to the other aerosol and GCJ methods described herein.

In another embodiment, the fluid mixture may include N2 combined with helium or neon and at least one of the following gases: argon, krypton, xenon, carbon dioxide. In one specific embodiment, the mixture ratio the aforementioned combination may be 1:2:1.8.

At block 910, the expanded fluid mixture (e.g., GCJ spray) may be projected towards the microelectronic substrate 118 and contacts the objects (e.g., kinetic and/or chemical interaction) on the surface, such the objects may be removed from the microelectronic substrate 118. The kinetic and/or chemical interaction of the GCJ spray may overcome the adhesive forces between the objects and the microelectronic substrate 118. The objects may be removed from the process chamber 104 via the vacuum system 134 or deposited elsewhere within the process chamber 104.

Figure 10:
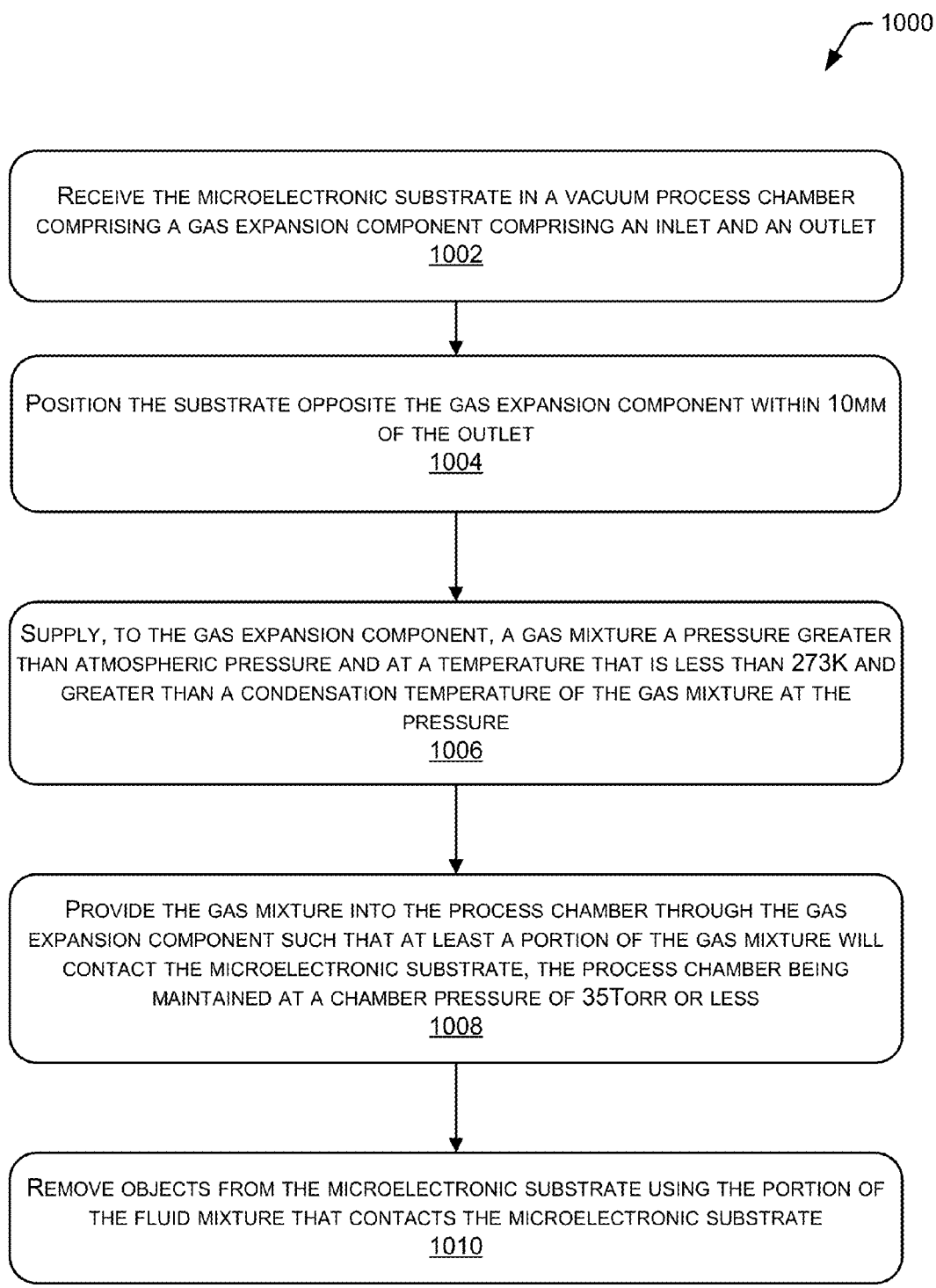
FIG. 10 includes a flow chart presenting another method of treating a microelectronic substrate with a fluid according to various embodiments.

FIG. 10 illustrates another flow chart 1000 for another method for treating a microelectronic substrate 118 with a cryogenic fluid. In this embodiment, the fluid mixture may generate a GCJ spray that may have a relatively low liquid concentration. As noted above, the temperature and pressure of the fluid mixture may have an impact on how much liquid (by weight) may be in the fluid mixture. In this instance, the liquid concentration of the fluid mixture may be optimized by varying the temperature.

Turning to FIG. 10, at block 1002 the microelectronic substrate 118 may be received in the process chamber 104 that may include a gas expansion component (GEC) (e.g., nozzle 300, 400). The GEC may be any of the nozzles 110 described herein, but may particularly be configured the same or similar to the TSG nozzles 200, the SSG nozzle 300 or the Flush nozzle 400. Generally, the nozzles may include an inlet orifice 402 to receive the fluid mixture and an outlet orifice 404 that flows the fluid mixture into the process chamber 104.

At block 1004, the system 100 may position the microelectronic substrate 118 opposite of the GEC, such that the outlet orifice 404 disposed above or adjacent to the microelectronic substrate 118. The GEC may be also be positioned at an angle relative to the surface of the microelectronic substrate 118. The surface being the portion where the microelectronic devices are manufactured. The angle may range between 0° and 90°. The GEC positioning may also optimized based on the gap distance 502 as described in FIG. 5. Generally, the GEC may likely be within 50 mm of the microelectronic substrate's 118 surface. But, in most embodiments, the gap distance 502 may be less than 20 mm for the aerosol or GCJ processes described herein. In one specific embodiment, the gap distance 502 may be about 5 mm prior to dispensing the fluid mixture through the GEC into the process chamber 104.

At block 1006, the system 110 may supplying the fluid mixture to the FEC at a pressure greater than atmospheric pressure and at a temperature that is less than 273K and greater than a condensation temperature of the fluid mixture at the given pressure. The condensation temperature may vary between different gases and may vary between different gas mixtures with different compositions and concentrations. A person of ordinary skill in the art may be able to determine the gas condensation temperature for the fluid mixture using known literature (e.g., phase diagrams) or empirical techniques based, at least in part, on observation and/or measurement of the fluid mixture using known techniques.

In one instance, the condensation temperature, at a given pressure, may the temperature at which a fluid may transition exist in a liquid phase. For example, for a fluid mixture being held above the condensation temperature indicates the fluid mixture may exist in a gaseous state without any liquid phase being present or with a very small amount of liquid (e.g., <1% by weight). In most embodiments, the fluid mixture temperature may vary between 50K and 200K, but more particularly between 70K and 150K depending on the fluid mixture composition which include gases with different condensation temperatures.

For example, in a $N_2$ fluid mixture embodiment, the amount of liquid by weight may be estimated by using the N2 phase diagram 604. For an incoming pressure of about 100 psi, the temperature of the fluid mixture may be greater than 100K to minimize the amount of liquid. The fluid mixture, in this embodiment, may not have any liquid, or at least be less than 1% by weight, when the incoming temperature is about 120K with a pressure of 100 psi.

At block 1008, the system 100 may provide the fluid mixture into the process chamber 104 through the GEC, such that at least a portion of the fluid mixture will contact the microelectronic substrate 118. In this embodiment, the process chamber 104 pressure may at least sub-atmospheric, but more particularly less than 10 Torr.

In one embodiment, the fluid mixture may include a combination of $N_2$ and argon at a ratio between 1:1 and 11:1, particularly at ratio less than 4:1. In other embodiments, the fluid mixture may include another carrier gas that may alter the mass and/or velocity of the GCJ spray. The carrier gases may include, but are not limited to, xenon, helium, neon, krypton, carbon dioxide or any combination thereof. In one embodiment, the fluid mixture may include a 1:1 to 4:1 mixture of $N_2$ to argon that may be mixed one or more of the following carrier gases: xenon, krypton, carbon dioxide or any combination thereof.

For example, when the carrier gases are mixed with $N_2$, argon, or a combination thereof (e.g., 1:1 to 4:1) the ratio between $N_2$ and argon, or a combination thereof should be done using a ratio mixture of at least 4:1 when using xenon, krypton, carbon dioxide or any combination thereof with up to a ratio mixture of 11:1. In contrast, when helium or neon or combined with $N_2$, argon, or a combination thereof (e.g., 1:1 to 4:1). The ratio mixture may be at least 1:4 between $N_2$, argon, or a combination thereof (e.g., 1:1 to 4:1) and helium, neon or combination thereof. The aforementioned combinations of N2, argon and/or the carrier gases may also apply to the other aerosol and GCJ methods described herein.

At block 1010, the expanded fluid mixture (e.g., GCJ spray) may be projected towards the microelectronic substrate 118 and contacts the objects (e.g., kinetic and/or chemical interaction) on the surface, such the objects may be removed from the microelectronic substrate 118. The kinetic and/or chemical interaction of the GCJ spray may overcome the adhesive forces between the objects and the microelectronic substrate 118. The objects may be removed from the process chamber 104 via the vacuum system 134 or deposited elsewhere within the process chamber 104.

Figure 11:
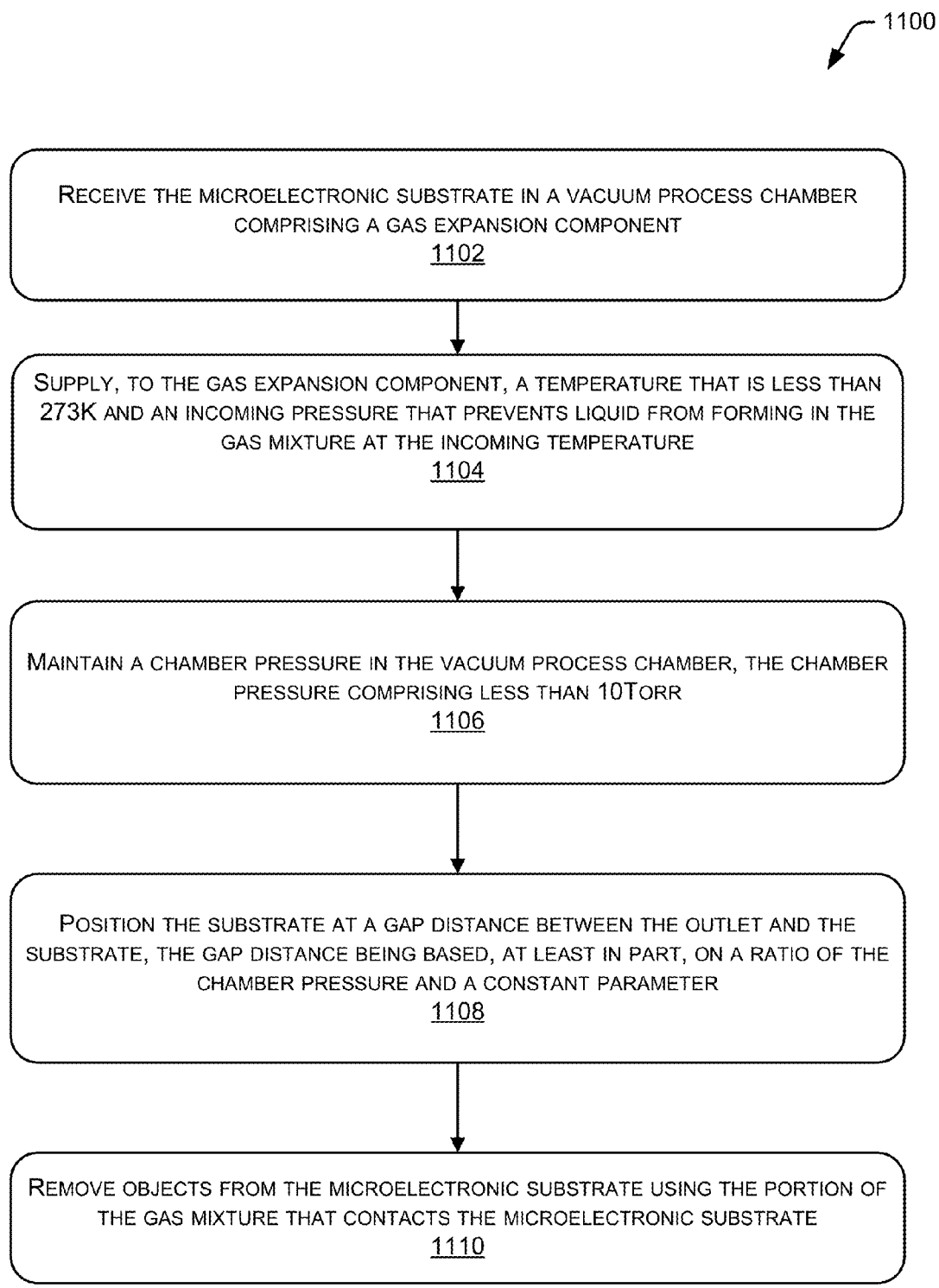
FIG. 11 includes a flow chart presenting another method of treating a microelectronic substrate with a fluid according to various embodiments.

FIG. 11 illustrates a flow chart 1100 for another method for treating a microelectronic substrate 118 with a cryogenic fluid. In this embodiment, the fluid mixture may generate a GCJ spray that may have a relatively low liquid concentration. As noted above, the temperature and pressure of the fluid mixture may have an impact on how much liquid (by weight) may be in the fluid mixture. In this instance, the liquid concentration of the fluid mixture may be optimized by varying the pressure. Further, the gap distance 502 may be determined using the controller 112 to use a calculation using the recipe pressure and a constant value that will be described below.

Turning to FIG. 11, at block 1102 the microelectronic substrate 118 may be received in the process chamber 104 that may include a gas expansion component (GEC) (e.g., nozzle 300). The GEC may be any of the nozzles 110 described herein, but may particularly be configured the same as or similar to the TSG nozzles 200, the SSG nozzle 300 or the Flush nozzle 400. Generally, the nozzles may include an inlet orifice 402 to receive the fluid mixture and an outlet orifice 404 that flows the fluid mixture into the process chamber 104.

At block 1104, the system 100 may supply a gas mixture to the GEC at an incoming temperature less than 273K and an incoming pressure that prevents liquid from forming in the gas mixture at the incoming temperature. For example, in an $N_2$ embodiment, the $N_2$ phase diagram 604 indicates that a fluid mixture at about 100K would likely have a pressure less than 100 psi to maintain the $N_2$ in gaseous phase. If the pressure was about 150 psi or higher, there would be a stronger probability that the liquid phase may be present in the $N_2$ process gas.

At block 1106, the system 100 may provide the fluid mixture into the process chamber 104 through the GEC, such that at least a portion of the fluid mixture will contact the microelectronic substrate 118. In this embodiment, the process chamber 104 pressure may at least sub-atmospheric, but more particularly less than 10 Torr.

In one embodiment, the fluid mixture may include a combination of $N_2$ and argon at a ratio between 1:1 and 11:1, particularly at ratio less than 4:1. In other embodiments, the fluid mixture may include another carrier gas that may alter the mass and/or velocity of the GCJ spray. The carrier gases may include, but are not limited to, xenon, helium, neon, krypton, carbon dioxide or any combination thereof. In one embodiment, the fluid mixture may include a 1:1 to 4:1 mixture of $N_2$ to argon that may be mixed one or more of the following carrier gases: xenon, krypton, carbon dioxide or any combination thereof.

For example, when the carrier gases are mixed with $N_2$, argon, or a combination thereof (e.g., 1:1 to 4:1) the ratio between $N_2$ and argon, or a combination thereof should be done using a ratio mixture of at least 4:1 when using xenon, krypton, carbon dioxide or any combination thereof with up to a ratio mixture of 11:1. In contrast, when helium or neon or combined with $N_2$, argon, or a combination thereof (e.g., 1:1 to 4:1). The ratio mixture may be at least 1:4 between $N_2$, argon, or a combination thereof (e.g., 1:1 to 4:1) and helium, neon or combination thereof. The aforementioned combinations of N2, argon and/or the carrier gases may also apply to the other aerosol and GCJ methods described herein.

At block 1108, the system 110 may position the microelectronic substrate 118 at a gap distance 502 between the outlet (e.g., outlet orifice 404) and the microelectronic substrate 118. The gap distance 502 being based, at least in part, on a ratio of the chamber pressure and a constant parameter with a value between 40 and 60, as shown in equation 1 in the description of FIG. 5. In one embodiment, the units of the constant parameter may have units of be length/pressure (e.g., mm/Torr).

At block 1110, the expanded fluid mixture may be projected towards the microelectronic substrate 118 and contacts the objects (e.g., kinetic and/or chemical interaction) on the surface, such the objects may be removed from the microelectronic substrate 118. The kinetic and/or chemical interaction of the GCJ spray may overcome the adhesive forces between the objects and the microelectronic substrate 118. The objects may be removed from the process chamber 104 via the vacuum system 134 or deposited elsewhere within the process chamber 104.

Figure 12:
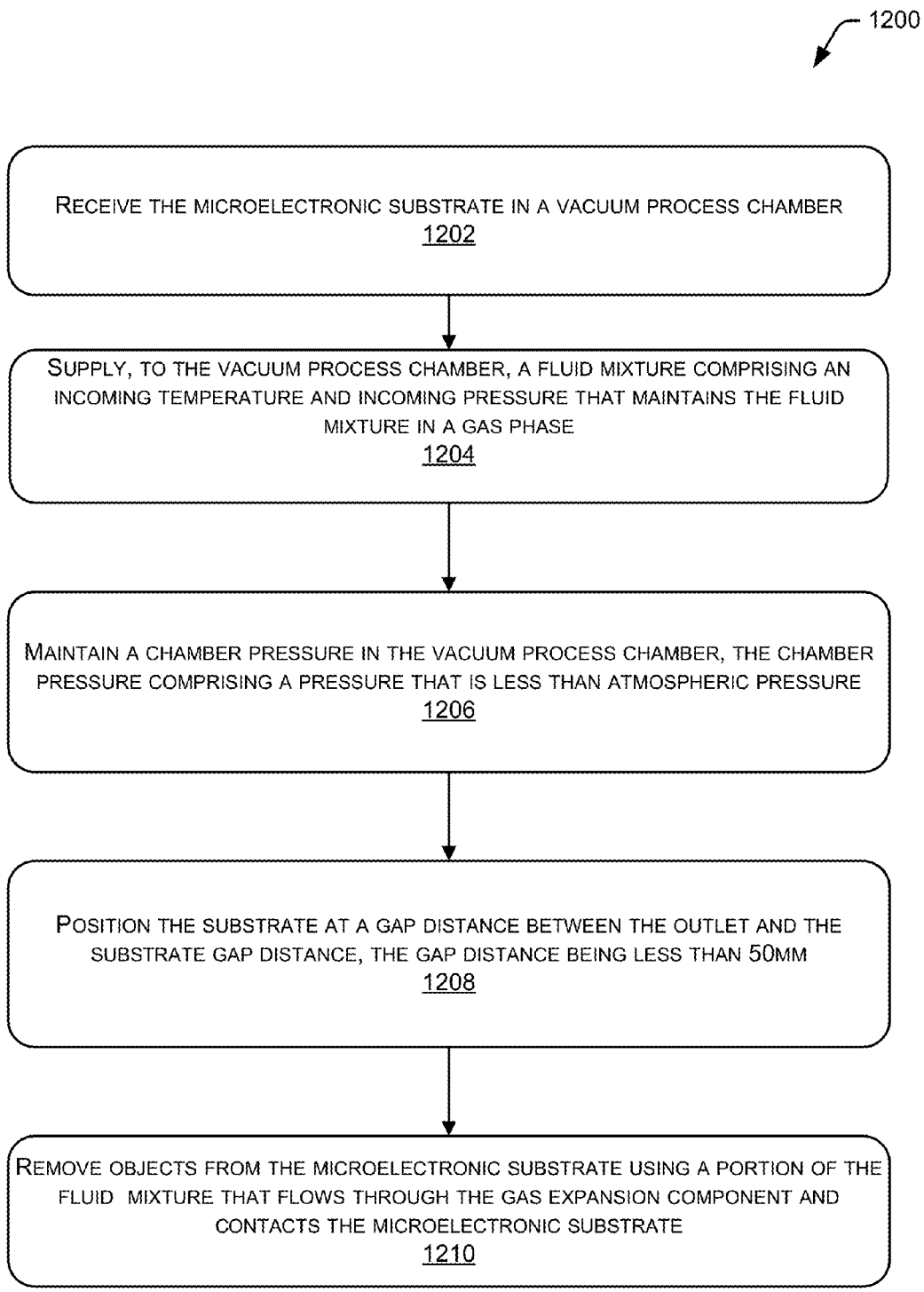
FIG. 12 includes a flow chart presenting another method of treating a microelectronic substrate with a fluid according to various embodiments.

FIG. 12 illustrates a flow chart 1200 for another method for treating a microelectronic substrate 118 with a cryogenic fluid. In this embodiment, the fluid mixture may generate a GCJ spray that may have a relatively low liquid concentration. As noted above, the temperature and pressure of the fluid mixture may have an impact on how much liquid (by weight) may be in the fluid mixture. In this instance, the system 100 may maintain a ratio between the incoming fluid mixture pressure and the chamber pressure 104 to optimize the momentum or composition (e.g., gas cluster, etc.). Additionally, the system 100 may also optimize the incoming fluid mixture pressure to control the liquid concentration of the incoming fluid mixture within the confines of the pressure ratio relationship between the incoming pressure and the process chamber 104 pressure.

Turning to FIG. 12, at block 1202 the microelectronic substrate 118 may be received in the process chamber 104 that may include a gas expansion component (GEC) (e.g., nozzle 300,400). The GEC may be any of the nozzles 110 described herein, but may particularly be configured the same as or similar to the TSG nozzles 200, the SSG nozzle 300 or the Flush nozzle 400. Generally, the nozzles may include an inlet orifice 402 to receive the fluid mixture and an outlet orifice 404 that flows the fluid mixture into the process chamber 104.

At block 1204, the system 100 may supplying the fluid mixture to the vacuum process chamber 104 and the system 100 may maintain the fluid mixture at a temperature and/or pressure that maintains the fluid mixture in a gas phase. The fluid mixture may include, but is not limited to, at least one of the following gases: nitrogen, argon, xenon, krypton, carbon oxide or helium.

In another embodiment, the fluid mixture may include $N_2$ combined with at least helium or neon and with at least one of the following gases: argon, krypton, xenon, carbon dioxide. In one specific embodiment, the ratio of the aforementioned fluid mixture combination may be about 1:2:2. In another more specific embodiment, the ratio of the aforementioned fluid mixture may be 1:2:1.8.

At block 1206, the system 100 may maintain the process chamber 104 pressure and the incoming fluid mixture pressure using a pressure ratio. In this way, the system 100 may insure that there may be a balance or relationship between the incoming pressure and the process pressure (e.g., ratio= (incoming pressure/process pressure). The pressure ratio may be a threshold value that may or may not be exceed or the pressure ratio may include a range that may be maintained despite changes to incoming pressure or chamber pressure. The pressure ratio value may range between 200 and 500,000. However, the pressure ratio may act a threshold that may or may not be exceed or designate a range that may be maintained given the recipe conditions stored in the controller 112. In this way, the pressure difference across the nozzle may be controlled to maintain GCJ/Aerosol spray momentum or composition (e.g., gas cluster size, gas cluster density, solid particle size, etc.).

In the pressure ratio embodiments, the values are in view of similar unit, such that the controller 112 may convert the pressures to the same or similar units to control the incoming and chamber pressures.

The upper threshold embodiments may include a pressure ratio that may not be exceed, such that the incoming pressure over the chamber pressure may be less than the upper threshold ratio. For example, the upper threshold values may be one of the following values: 300000, 5000, 3000, 2000, 1000 or 500.

In another embodiment, the controller 112 may maintain the incoming and process pressure to be within a range of the pressure ratio values. Exemplary ranges may include, but are not limited to: 100000 to 300000, 200000 to 300000, 50000 to 100000, 5000 to 25000, 200 to 3000, 800 to 2000, 500 to 1000 or 700 to 800.

At block 1208, the system 110 may position the microelectronic substrate 118 at a gap distance 502 between the outlet (e.g., outlet orifice 404) and the microelectronic substrate 118. The gap distance 502 being based, at least in part, on a ratio of the chamber pressure and a constant parameter with a value between 40 and 60, as shown in equation 1 in the description of FIG. 5. In one embodiment, the units of the constant parameter may have units of be length/pressure (e.g., mm/Torr).

At block 1210, the expanded fluid mixture may be projected towards the microelectronic substrate 118 and contacts the objects (e.g., kinetic and/or chemical interaction) on the surface, such the objects may be removed from the microelectronic substrate 118. The kinetic and/or chemical interaction of the GCJ spray may overcome the adhesive forces between the objects and the microelectronic substrate 118. The objects may be removed from the process chamber 104 via the vacuum system 134 or deposited elsewhere within the process chamber 104.

Figure 13:
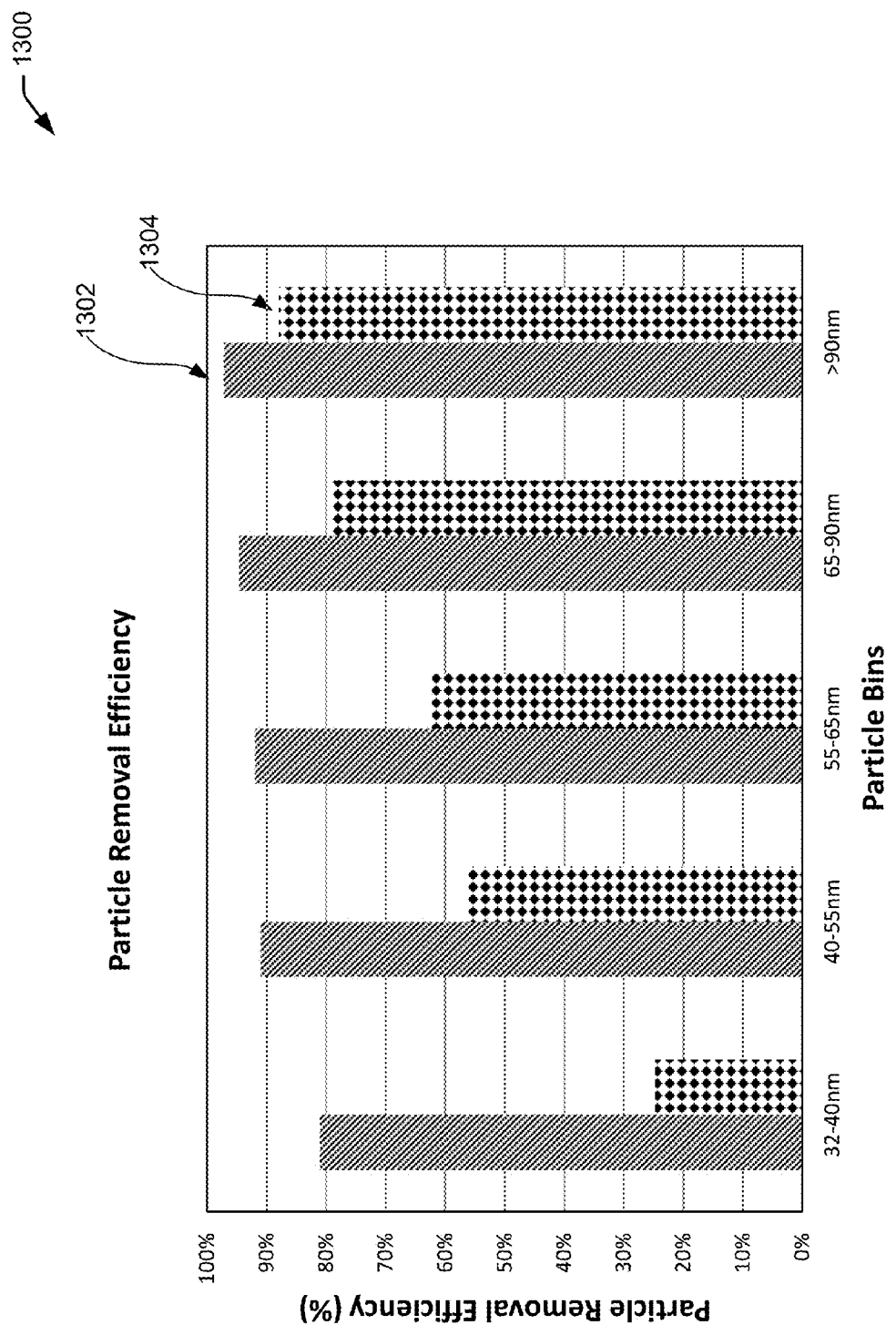
FIG. 13 includes a bar chart of particle removal efficiency improvement between a non-liquid-containing fluid mixture and liquid-containing fluid mixture according to various embodiments.

FIG. 13 includes a bar chart 1300 of particle removal efficiency improvement between a non-liquid-containing fluid mixture (e.g., GCJ) and liquid-containing fluid mixture (e.g., aerosol). One of the unexpected results disclosed herein relates to improved particle efficiency for sub-100 nm particles and maintaining, or improving, particle removal efficiency for particles greater than 100 nm. Previous techniques may include treating microelectronic substrates with cryogenic fluid mixtures that have a liquid concentration greater than 10%. Newer techniques that generated the unexpected results may include treating microelectronic substrates 118 with cryogenic fluid mixtures that have no liquid concentration (by weight) or a liquid concentration less than 1%.

In the FIG. 13 embodiment, microelectronic substrates 118 were deposited with silicon nitride particles using a commercially available deposition system. The silicon nitride particles had a similar density and sizes for both tests. The baseline cryogenic process (e.g., liquid concentration >1% by weight) was applied to at least one microelectronic substrate 118 and the GCJ was applied a different group of microelectronic substrates 118 also covered with silicon nitride particles. In this instance, the GCJ process include a nitrogen to argon flow ratio of 2:1 with an inlet pressure of 83 psig prior to the nozzle 110 which separated the high pressure fluid source from the vacuum chamber that was maintained at about 9 Torr. The nozzle 110 inlet diameter was ~0.06". The gas distance 502 was between 2.5-4 mm. The wafer was passed underneath the nozzle two times such that a region contaminated with the particles would be exposed twice to the GCJ spray. The particles were measured before and after processing using a KLA SURF SCAN SP2-XP from KLA-Tencor™ of Milpitas, Calif.

Under previous techniques, as shown in FIG. 13, sub-100 nm particle removal efficiency (PRE) decreased from greater than 80% for particles greater than 90 nm down to less than 30% for particles less than 42 nm. Specifically, the PRE dropped from ~87% (@>90 nm particles) to ~78% for particles between 65 nm to 90 nm. The falloff in PRE between 55 nm-65 nm particles and 40 mn-55 nm was more pronounced. The PRE dropped to ~61% and ~55%, respectively. Lastly, the greatest decrease in PRE was seen for particles less than 40 nm, ~24% PRE.

In view of this data, improvements to sub-100 nm particle efficiency were expected to exhibit a similar diminishing return with decreasing particle size. However, the GCJ techniques disclosed herein, not only improved sub-100 nm PRE, but maintained PRE to a higher degree than expected. For example, as shown in FIG. 13, GCJ PRE didn't drop below ~80% for any of the particle bin sizes.

As shown in FIG. 13, the GCJ PRE for particles greater than 90 nm improved to over 95% which is more than a 5% improvement over results using previous techniques. Further, the GCJ process demonstrated greater ability to remove sub-100 nm particles as particle sizes decreased when compared to previous techniques. For example, the 65 nm-90 nm, 55 nm-65 nm and the 40 nm-55 nm bins had at least 90% PRE. The improvements ranging between ~15% to ~35% for each bin size. However, the greatest improvement was for the sub-40 nm bin size with a PRE improvement from 25% to ~82%.

The unexpected results for the GCJ PRE were two-fold. First, the increase in PRE for particles greater than 90 nm coupled with the increased PRE for sub-90 nm particles. Second, that the difference between the bins sizes for the GCJ process had a much tighter distribution than the PRE results for the aerosol process using similar ranges of process conditions.

Figure 14:
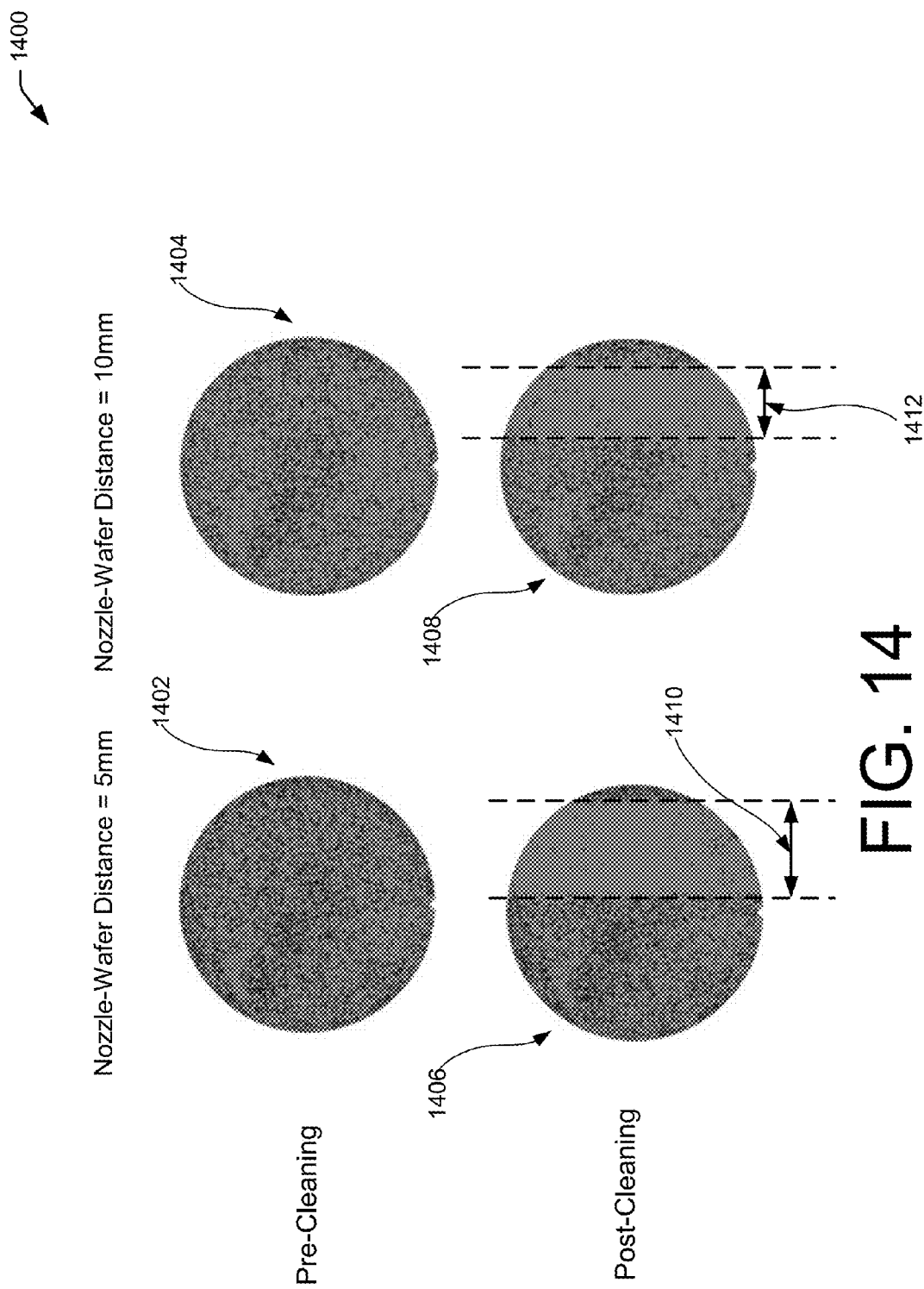
FIG. 14 includes particle maps of microelectronic substrates that illustrate a wider cleaning area based, at least in part, on a smaller gap distance between a nozzle and the microelectronic substrate.

FIG. 14 includes particle maps 1400 of microelectronic substrates that illustrate a wider cleaning area based, at least in part, on a smaller gap distance 502 between a nozzle 110 and the microelectronic substrate 118. Generally, as gas expands from a high pressure environment into a low pressure environment the gas is more likely to cover a larger surface area, or coverage area, the further gas is away from the initial expansion point. In this way, the effective cleaning area was thought to be larger when the gas nozzle was positioned farther away from the microelectronic substrate 118. However, this was not the case, in fact having a smaller gap distance 502 achieved a completely counterintuitive result to obtaining a wider cleaning area on the microelectronic substrate 118.

As shown in the post-cleaning particles maps the 5 mm gap distance has a wider cleaning area than the 10 mm gap distance. The 5 mm gap particle map 1406 shows that for the right half of the microelectronic substrate 118, the PRE was ~70%. In contrast, the 10 mm gap particle map 1408 had a ~50% PRE for the right half of the 200 mm microelectronic substrate 118. In this instance, the 5 mm gap particle map indicates a cleaned area 1410 that is about 80 mm wide from a nozzle 110 with an outlet orifice of no more than 6 mm. It was unexpected that a nozzle 110 with such a small outlet orifice would be able to have an effective cleaning distance more than 12 times its own size.

Figure 15:
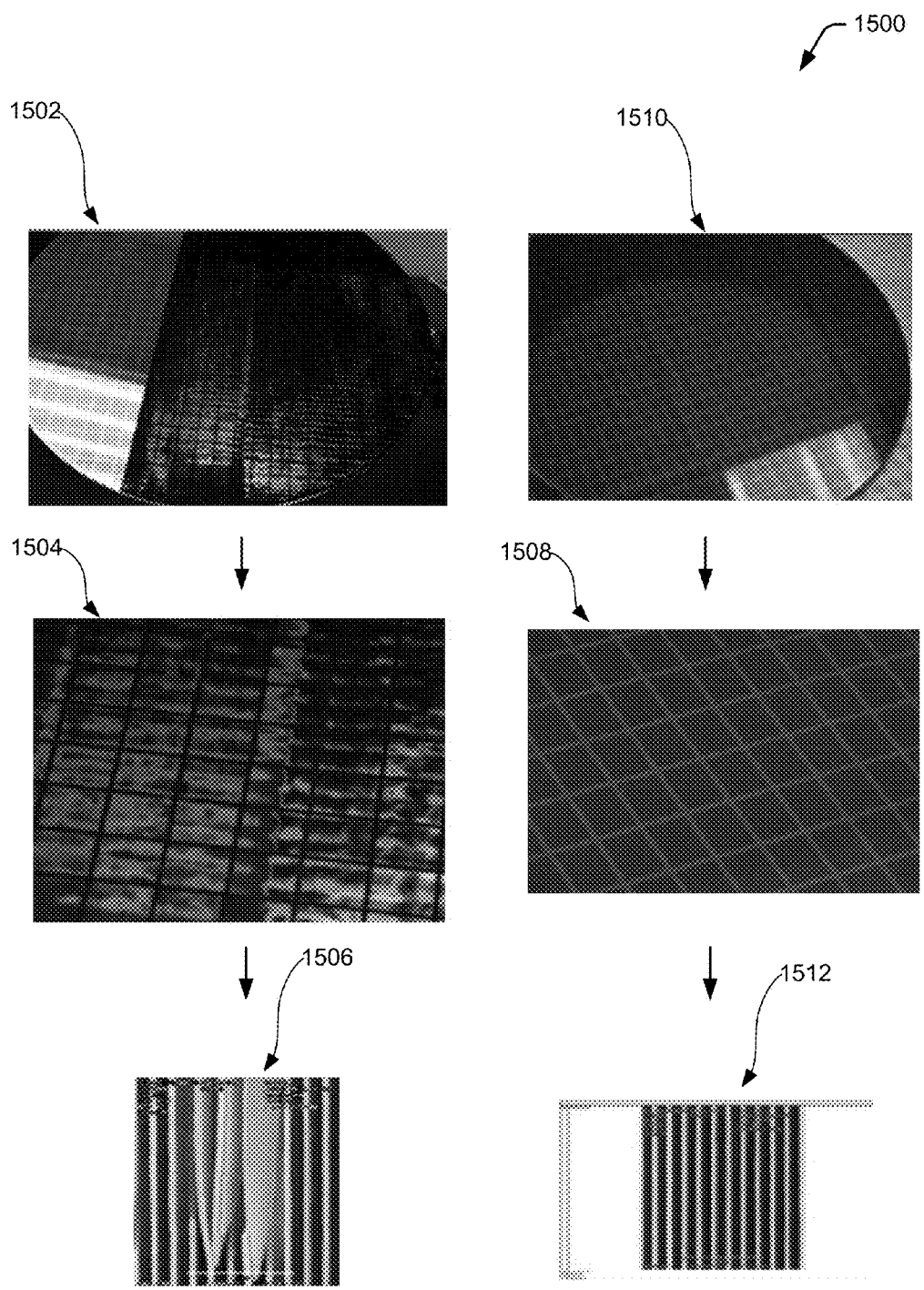
FIG. 15 includes pictures of microelectronic substrate features that show different feature damage differences between previous techniques and techniques disclosed herein.

FIG. 15 includes pictures 1500 of microelectronic substrate features that show different feature damage differences between previous techniques (e.g., aerosol) and techniques (e.g., GCJ) disclosed herein. The difference in damage is visible to the naked eye and confirmed by closer inspection by a scanning electron microscope (SEM). In this embodiment, polysilicon features were formed on the microelectronic substrate using known patterning techniques. The features had a width of about 20 nm and a height of about 125 nm. Separate feature samples (e.g., line structures) were exposed to processes similar to the aerosol and GCJ processes disclosed herein.

Under the previous techniques, damage to line structures was evidenced by the discoloration in the pictures 1502, 1504 of the microelectronic substrate 118 that was exposed to an aerosol cleaning process. The visible line damage is corroborated by the aerosol SEM picture 1506. In contrast, the discoloration is not present in the GCJ pictures 1508, 1510 and damage is not shown in the GCJ SEM picture 1512. Accordingly, the lack of discoloration in the GCJ pictures 1508, 1510 and lack of damage in the GCJ SEM picture 1512 suggests that the GCJ techniques described herein are less destructive to the microelectronic substrate 118 than the aerosol processes.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention. For example, the embodiments described above may be incorporated together and may add or omit portions of the embodiments as desired. Hence, the number of embodiments may not be limited to only the specific embodiments described herein, such that a person of ordinary skill may craft additional embodiments using the teachings described herein.

What is claimed is:

1. A method for treating a microelectronic substrate, comprising
    receiving the microelectronic substrate in a vacuum process chamber, wherein the vacuum process chamber comprises a fluid expansion component comprising an inlet and an outlet, wherein the process chamber is at a pressure of 35 Torr or less, and wherein the microelectronic substrate is positioned to provide a gap distance between the substrate and the outlet of the fluid expansion component in the range from 2 mm to 50 mm;
    supplying a pressurized and cooled fluid mixture to the inlet of the fluid expansion component, wherein the fluid mixture comprises at least one of helium and hydrogen and at least one of nitrogen and argon, wherein at least 50 weight percent of the fluid mixture is at least one of helium, neon, and hydrogen, and wherein the fluid mixture as supplied to the inlet of the fluid expansion component is at a temperature in the range of 70K to 270K and an incoming pressure that causes the fluid mixture to be in a gas phase comprising less than 1 weight percent liquid;
    expanding the pressurized and cooled fluid mixture into the process chamber through the outlet of the fluid expansion component such that at least a portion of the expanded fluid mixture laterally flows across and contacts the microelectronic substrate; and
    removing objects from the microelectronic substrate using the expanded fluid mixture.

2. The method of claim 1, further comprising adjusting the incoming pressure or the chamber pressure to maintain a pressure ratio less than 5000, the pressure ratio comprising the incoming pressure over the chamber pressure.

3. The method of claim 1, further comprising adjusting the incoming pressure or the chamber pressure to maintain a pressure ratio less than 3000, the pressure ratio comprising the incoming pressure over the chamber pressure.

4. The method of claim 1, further comprising adjusting the incoming pressure or the chamber pressure to maintain a pressure ratio less than 2000, the pressure ratio comprising the incoming pressure over the chamber pressure.

5. The method of claim 1, further comprising adjusting the incoming pressure or the chamber pressure to maintain a pressure ratio less than 1000, the pressure ratio comprising the incoming pressure over the chamber pressure.

6. The method of claim 1, further comprising adjusting the incoming pressure or the chamber pressure to maintain a pressure ratio less than 500, the pressure ratio comprising the incoming pressure over the chamber pressure.

7. The method of claim 1, further comprising adjusting the incoming pressure or the chamber pressure to maintain a pressure ratio between 200 and 3000, the pressure ratio comprising the incoming pressure over the chamber pressure.

8. The method of claim 1, wherein the fluid mixture further comprises at least one of the following: xenon, krypton, and carbon oxide.

9. The method of claim 1, wherein the fluid mixture comprises nitrogen combined with at least one of the following: hydrogen, helium or neon, and with at least one of the following: argon, krypton, xenon, and carbon dioxide.

10. The method of claim 9, wherein the gap distance comprises a distance of 2 mm to 10 mm.

11. A method for treating a microelectronic substrate, comprising
    receiving the microelectronic substrate in a process chamber having a chamber pressure of 35 Torr or less, the vacuum process chamber comprising a fluid expansion component comprising an inlet and an outlet, and wherein the microelectronic substrate is positioned to provide a gap distance between the substrate and the outlet in the range from 2 mm to 50 mm;
    supplying a pressurized and cooled fluid mixture to the inlet of the fluid expansion component, wherein the fluid mixture as supplied to the inlet is at a temperature in the range of 70 k to 270K, the fluid mixture comprising at least one of hydrogen, neon and He and at least one of nitrogen and argon:
    expanding the fluid mixture into the process chamber through the outlet of the fluid expansion component such that at least a portion of the fluid mixture laterally flows across and contacts the microelectronic substrate; and
    removing objects from the microelectronic substrate using the expanded fluid mixture.

12. The method of claim 11, wherein the fluid mixture further comprises at least one of krypton, xenon, carbon dioxide, or a combination thereof.

13. The method of claim 11, wherein the fluid mixture as supplied to the inlet is at a temperature between 70K and 120K.

14. The method of claim 11, wherein the process chamber is maintained at less than 10 Torr.

15. The method of claim 11, wherein at least one of hydrogen, neon, and/or He comprises between 10% and 50% by weight of the fluid mixture.

16. The method of claim 11, wherein at least one of hydrogen, neon, and He comprises between 20% and 40% by weight of the fluid mixture.

17. The method of claim 11, wherein the providing of the fluid mixture into the process chamber comprises flowing between 120 standard liters pt minute (slm) and 140 slm of at least one of hydrogen, neon, and He and between 30 slm and 45 slm of at least one of nitrogen and argon to the process chamber.

18. The method of claim 11, wherein the fluid mixture comprises a gaseous portion and a liquid portion.

19. The method of claim 18, wherein the fluid mixture as supplied to the inlet of the fluid expansion component comprises a liquid concentration of no more than 1% by weight of the fluid mixture.

20. The method of claim 18, wherein the fluid mixture as supplied to the inlet of the fluid expansion component comprises a liquid concentration of at least 10% by weight of the fluid mixture.

* * * * *

UNITED STATES PATENT AND TRADEMARK OFFICE
CERTIFICATE OF CORRECTION

PATENT NO.        : 10,020,217 B2
APPLICATION NO.   : 14/876242
DATED             : July 10, 2018
INVENTOR(S)       : Jeffery W. Butterbaugh, Chimaobi W. Mbanaso and David Scott Becker Page 1 of 1

It is certified that error appears in the above-identified patent and that said Letters Patent is hereby corrected as shown below:

In the Claims

Column 28, Lines 17, Claim 8: "carbon oxide." should be -- carbon dioxide. --

Signed and Sealed this
Second Day of June, 2020

Andrei Iancu
*Director of the United States Patent and Trademark Office*